(12) United States Patent
Miller

(10) Patent No.: US 12,103,843 B2
(45) Date of Patent: Oct. 1, 2024

(54) MEMS MIRROR ARRAYS WITH REDUCED CROSSTALK

(71) Applicant: CALIENT.AI INC., Goleta, CA (US)

(72) Inventor: Scott A. Miller, Ithaca, NY (US)

(73) Assignee: CALIENT.AI INC., Goleta, CA (US)

( * ) Notice: Subject to any disclaimer, the term of this patent is extended or adjusted under 35 U.S.C. 154(b) by 107 days.

(21) Appl. No.: 17/647,670

(22) Filed: Jan. 11, 2022

(65) Prior Publication Data

US 2022/0227621 A1 Jul. 21, 2022

Related U.S. Application Data

(60) Provisional application No. 63/139,516, filed on Jan. 20, 2021.

(51) Int. Cl.
*B81B 7/04* (2006.01)
*G02B 26/08* (2006.01)
*B81C 1/00* (2006.01)

(52) U.S. Cl.
CPC ............ *B81B 7/04* (2013.01); *G02B 26/0833* (2013.01); *B81B 2201/042* (2013.01); *B81B 2203/00* (2013.01); *B81B 2203/0307* (2013.01); *B81B 2203/0361* (2013.01); *B81B 2207/053* (2013.01); *B81C 1/00269* (2013.01)

(58) Field of Classification Search
CPC ....... B81B 3/0021; B81B 7/04; B81B 7/0067; B81B 2207/053; B81B 2203/0307; B81B 2203/058; B81B 2201/038; B81B 2201/042; B81B 2203/0361; G02B 26/0833
See application file for complete search history.

(56) References Cited

U.S. PATENT DOCUMENTS

| | | |
|---|---|---|
| 3,493,820 A | 2/1970 | Rosvold |
| 4,104,086 A | 8/1978 | Bondur et al. |
| 4,421,381 A | 12/1983 | Ueda et al. |
| 4,509,249 A | 4/1985 | Goto et al. |
| 4,519,128 A | 5/1985 | Chesebro et al. |
| 4,553,436 A | 11/1985 | Hansson |
| 4,571,819 A | 2/1986 | Rogers et al. |
| 4,598,585 A | 7/1986 | Boxenhorn |

(Continued)

FOREIGN PATENT DOCUMENTS

| | | | | |
|---|---|---|---|---|
| CN | 1672081 A | * | 9/2005 | ......... G02B 26/0841 |
| DE | 4224601 A1 | | 1/1994 | |

(Continued)

OTHER PUBLICATIONS

"Lucent's New All-Optical Router Uses Bell Labs Microscopic Mirrors," Bell Labs press release pp. 104, Nov. 10, 1999 ( http://www.bell.labs.com/news/1999/november/10/1.html).

(Continued)

*Primary Examiner* — Tan Le
(74) *Attorney, Agent, or Firm* — FISHMAN STEWART PLLC; Cecily Anne O'Regan; Jeong Hee Seo

(57) ABSTRACT

Methods, apparatuses and methods of manufacture are described for a MEMS mirror array with reduced crosstalk. The MEMS mirror array has a plurality of reflective surfaces wherein each reflective surface has a resonant frequency, and further wherein adjacent reflective surfaces do not have the same resonant frequency.

18 Claims, 18 Drawing Sheets

(56) References Cited

U.S. PATENT DOCUMENTS

| | | |
|---|---|---|
| 4,613,203 A | 9/1986 | Proetel et al. |
| 4,654,663 A | 3/1987 | Alsenz et al. |
| 4,670,092 A | 6/1987 | Motamedi |
| 4,688,069 A | 8/1987 | Joy et al. |
| 4,706,374 A | 11/1987 | Murakami |
| 4,738,500 A | 4/1988 | Grupp et al. |
| 4,784,720 A | 11/1988 | Douglas |
| 4,851,080 A | 7/1989 | Howe et al. |
| 4,855,017 A | 8/1989 | Douglas |
| 4,876,217 A | 10/1989 | Zdebel |
| 4,922,756 A | 5/1990 | Henrion |
| 5,016,072 A | 5/1991 | Greiff |
| 5,068,203 A | 11/1991 | Logsdon et al. |
| 5,083,857 A | 1/1992 | Hornbeck |
| 5,095,752 A | 3/1992 | Suzuki et al. |
| 5,097,354 A | 3/1992 | Goto |
| 5,121,180 A | 6/1992 | Beringhause et al. |
| 5,126,812 A | 6/1992 | Greiff |
| 5,172,262 A | 12/1992 | Hornbeck |
| 5,198,390 A | 3/1993 | MacDonald et al. |
| 5,199,088 A | 3/1993 | Magel |
| 5,203,208 A | 4/1993 | Bernstein |
| 5,221,987 A | 6/1993 | Laughlin |
| 5,226,321 A | 7/1993 | Varnham et al. |
| 5,235,187 A | 8/1993 | Arney et al. |
| 5,287,082 A | 2/1994 | Arney et al. |
| 5,316,979 A | 5/1994 | MacDonald et al. |
| 5,345,824 A | 9/1994 | Sherman et al. |
| 5,391,236 A | 2/1995 | Krut et al. |
| 5,393,375 A | 2/1995 | MacDonald et al. |
| 5,397,904 A | 3/1995 | Arney et al. |
| 5,399,415 A | 3/1995 | Chen et al. |
| 5,426,070 A | 6/1995 | Shaw et al. |
| 5,427,975 A | 6/1995 | Sparks et al. |
| 5,428,259 A | 6/1995 | Suzuki |
| 5,449,903 A | 9/1995 | Arney et al. |
| 5,454,906 A | 10/1995 | Baker et al. |
| 5,463,246 A | 10/1995 | Matsunami |
| 5,471,332 A | 11/1995 | Shiragaki et al. |
| 5,483,158 A | 1/1996 | Van et al. |
| 5,485,039 A | 1/1996 | Fujita et al. |
| 5,488,862 A | 2/1996 | Neukermans et al. |
| 5,501,893 A | 3/1996 | Laermer et al. |
| 5,506,175 A | 4/1996 | Zhang et al. |
| 5,524,153 A | 6/1996 | Laor |
| 5,536,988 A | 7/1996 | Zhang et al. |
| 5,554,304 A | 9/1996 | Suzuki |
| 5,563,343 A | 10/1996 | Shaw et al. |
| 5,583,373 A | 12/1996 | Ball et al. |
| 5,591,679 A | 1/1997 | Jakobsen et al. |
| 5,599,744 A | 2/1997 | Koh et al. |
| 5,600,383 A | 2/1997 | Hornbeck |
| 5,608,264 A | 3/1997 | Gaul |
| 5,610,335 A | 3/1997 | Shaw et al. |
| 5,611,888 A | 3/1997 | Bosch et al. |
| 5,611,940 A | 3/1997 | Zettler |
| 5,628,917 A | 5/1997 | MacDonald et al. |
| 5,629,790 A | 5/1997 | Neukermans et al. |
| 5,637,189 A | 6/1997 | Peeters et al. |
| 5,642,015 A | 6/1997 | Whitehead et al. |
| 5,645,684 A | 7/1997 | Keller |
| 5,646,067 A | 7/1997 | Gaul |
| 5,648,618 A | 7/1997 | Neukermans et al. |
| 5,670,881 A | 9/1997 | Arakawa et al. |
| 5,673,139 A | 9/1997 | Johnson |
| 5,682,062 A | 10/1997 | Gaul |
| 5,696,619 A | 12/1997 | Knipe et al. |
| 5,703,728 A | 12/1997 | Smith et al. |
| 5,719,073 A | 2/1998 | Shaw et al. |
| 5,726,073 A | 3/1998 | Zhang et al. |
| 5,739,941 A | 4/1998 | Knipe et al. |
| 5,759,913 A | 6/1998 | Fulford, Jr. et al. |
| 5,770,465 A | 6/1998 | MacDonald et al. |
| 5,784,187 A | 7/1998 | Cunningham et al. |
| 5,798,557 A | 8/1998 | Salatino et al. |
| 5,804,084 A | 9/1998 | Nasby et al. |
| 5,814,889 A | 9/1998 | Gaul |
| 5,846,849 A | 12/1998 | Shaw et al. |
| 5,847,454 A | 12/1998 | Shaw et al. |
| 5,853,959 A | 12/1998 | Brand et al. |
| 5,869,916 A | 2/1999 | Suzuki et al. |
| 5,907,425 A | 5/1999 | Dickensheets et al. |
| 5,912,094 A | 6/1999 | Aksyuk et al. |
| 5,912,608 A | 6/1999 | Asada |
| 5,915,168 A | 6/1999 | Salatino et al. |
| 5,920,417 A | 7/1999 | Johnson |
| 5,933,746 A | 8/1999 | Begley et al. |
| 5,959,760 A | 9/1999 | Yamada et al. |
| 5,960,132 A | 9/1999 | Lin |
| 5,969,848 A | 10/1999 | Lee et al. |
| 5,973,396 A | 10/1999 | Farnworth |
| 5,998,816 A | 12/1999 | Nakaki et al. |
| 5,998,906 A | 12/1999 | Jerman et al. |
| 5,999,303 A | 12/1999 | Drake |
| 6,000,280 A | 12/1999 | Miller et al. |
| 6,002,818 A | 12/1999 | Fatehi et al. |
| 6,020,272 A | 2/2000 | Fleming |
| 6,028,689 A | 2/2000 | Michalicek et al. |
| 6,030,887 A | 2/2000 | Desai et al. |
| 6,040,935 A | 3/2000 | Adrian |
| 6,044,705 A | 4/2000 | Neukermans et al. |
| 6,066,265 A | 5/2000 | Galvin et al. |
| 6,072,617 A | 6/2000 | Henck |
| 6,074,890 A | 6/2000 | Yao et al. |
| 6,075,639 A | 6/2000 | Kino et al. |
| 6,078,016 A | 6/2000 | Yoshikawa et al. |
| 6,097,858 A | 8/2000 | Laor |
| 6,097,859 A | 8/2000 | Solgaard et al. |
| 6,097,860 A | 8/2000 | Laor |
| 6,101,299 A | 8/2000 | Laor |
| 6,107,109 A | 8/2000 | Akram et al. |
| 6,107,115 A | 8/2000 | Atobe et al. |
| 6,121,552 A | 9/2000 | Brosnihan et al. |
| 6,128,121 A | 10/2000 | Choi et al. |
| 6,146,248 A | 11/2000 | Jairath et al. |
| 6,178,284 B1 | 1/2001 | Bergmann et al. |
| 6,220,561 B1 | 4/2001 | Garcia |
| 6,239,473 B1 | 5/2001 | Adams et al. |
| 6,245,590 B1 | 6/2001 | Wine et al. |
| 6,253,001 B1 | 6/2001 | Hoen |
| 6,262,827 B1 | 7/2001 | Ueda et al. |
| 6,285,490 B1 | 9/2001 | Meier et al. |
| 6,295,154 B1 | 9/2001 | Laor et al. |
| 6,428,713 B1 | 8/2002 | Christenson et al. |
| 6,753,638 B2 | 6/2004 | Adams et al. |
| 6,825,967 B1 | 11/2004 | Chong et al. |
| 7,261,826 B2 | 8/2007 | Adams et al. |
| 2002/0011759 A1 | 1/2002 | Adams et al. |
| 2003/0053232 A1 | 3/2003 | Dalziel |
| 2004/0245890 A1 | 12/2004 | Adams et al. |
| 2005/0275946 A1 | 12/2005 | Choo et al. |
| 2006/0197215 A1* | 9/2006 | Potter ............... B81C 1/00269 257/E23.184 |
| 2008/0190198 A1 | 8/2008 | Prandi et al. |
| 2008/0284028 A1 | 11/2008 | Greywall |
| 2009/0027748 A1 | 1/2009 | Sprague et al. |
| 2009/0196623 A1 | 8/2009 | Detry |
| 2010/0263998 A1 | 10/2010 | Anderson et al. |
| 2011/0018095 A1 | 1/2011 | Booth, Jr. et al. |
| 2011/0049652 A1* | 3/2011 | Wu ................. B81C 1/00269 438/51 |
| 2011/0140569 A1 | 6/2011 | Moidu |
| 2012/0133023 A1 | 5/2012 | Booth, Jr. et al. |
| 2012/0287492 A1 | 11/2012 | Lee |
| 2014/0014480 A1 | 1/2014 | Anderson et al. |
| 2018/0059405 A1 | 3/2018 | Allegato et al. |
| 2023/0023348 A1* | 1/2023 | Miller ............... G02B 26/0833 |
| 2023/0136105 A1* | 5/2023 | Miller ............... G02B 17/002 359/872 |

FOREIGN PATENT DOCUMENTS

| | | |
|---|---|---|
| JP | S60107017 A | 6/1985 |
| JP | H04343318 A | 11/1992 |

(56) References Cited

FOREIGN PATENT DOCUMENTS

| WO | 9418697 | A1 | 8/1994 |
|---|---|---|---|
| WO | 9704283 | A2 | 2/1997 |
| WO | 9936941 | A2 | 7/1999 |
| WO | 9936948 | A1 | 7/1999 |
| WO | 2001057902 | A2 | 8/2001 |
| WO | 2015074484 | A1 | 5/2015 |
| WO | 2022159928 | A1 | 7/2022 |

OTHER PUBLICATIONS

Arney, et al., "Formation of Submicron Silicon-On-Insulator Structures by Lateral Oxidation of Substrate-Silicon Islands," J. Vac. Sci. Technol. B vol. 6 No. 1, pp. 341-345, (Jan./Feb. 1988).

Brosnihan, et al., "Embedded Interconnect & Electrical Isolation for High-Aspect-Ratio, SOI Inertial Instruments," Berkeley Sensor & Actuator Sensor, pp. 637-640, Transducers '97 1997 International Conference on Solid-State Sensors and Actuators (Chicago, Jun. 16-19, 1997).

Bryzek, et al. "Micromachines on the March," IEEE Spectrum, pp. 20-31 (1994).

De Bruin, et al., "Second-Order Effects in Self-Testable Accelerometers," IC Sensors, IEEE, pp. 149-152 (1990).

Fedder, et al. , "Laminated High-Aspect-Ratio Microstructures in a Conventional CMOS Process," Proceedings of the IEEE Micro Electro Mechanical Systems Workshop, San Diego, CA, pp. 13-18 (Feb. 1996).

Field, et al. "Micromachined 1 x2 Optical-Fiber Switch," Sensors and Actuators A, 53, pp. 311-315, (1996).

Ford, et al. "Wavelength Add-Drop Switching Using Tilting Micromirrors, " Journal of Lightwave Technology, vol. 17, No. 5, pp. 904-911 (May 1999).

Gosele, et al., "Wafer Bonding for Microsystems Technologies," Sensors and Actuators A, vol. 74, pp. 161-168 (1999).

Graf, Radio Shack Dictionary of Electronics, p. 639, Definition of Variable Capacitor with Picture (1974).

Hirano, et al., "Design, Fabrication, and Operation of Submicron Gap Comb-Drive Microactuators," J. of Microelectromechanical Systems, vol. 1, No. 1, pp. 52-59, (Mar. 1992).

Hoffmann, et al. Monolithic Three-Dimensional Single-Crystal Silicon Microelectromechanical Systems:, Sensors and Materials, 10, 337-350 (1998).

Hornbeck, "Digital Light Processing for High-Brightness, High-Resolution Applications," SPIE vol. 3013, San Jose, CA, pp. 27-40 (Feb. 1997).

Jaecklin, et al., "Comb Actuators for XY-Microstages," Sensors and Actuators, A, 39, pp. 83-89 (1993).

Juan et al., "High-Aspect-Ratio Si Vertical Micromirror Arrays for Optical Switching," Journal of Microelectromechanical Systems, vol. 7, No. 2, pp. 207-213 (Jun. 1998).

Kuehnel et al., "A Surface Micromachine Silicon Acclerometer with On-Chip Detection Circuitry," Sensors and Actuators A 45, pp. 7-16 (May 1994).

Lee, "Two-Depth, Single Crystal Silicon Microelectromechanical Systems", A Dissertation Presented to the Faculty of the Graduate School of Cornell University in Partial Fulfillment of the Requirements for the Degree of Doctor of Philosophy, 2000.

Lee, et al. "Mulitple Depth, Single Crystal Silicon MicroActuators for Large Displacement Fabricated by Deep Reactive on Etching," Solid-State Sensor and Actuator Workshop, Hilton Head Island, SC, pp. 45-50 (Jun. 8-11, 1998).

Lee, et al. "Single Crystal Silicon (SCS) XY-Stage Fabricated by DRIE and IR alignment," MEMS 2000, The Thirteenth Annual International Conference on Micro Electro Mechanical Systems, Miyazaki, Japan, pp. 28-33 (Jan. 23-27, 2000).

Legtenberg, et al. "Comb-drive actuators for large displacements," Journal of Micromechanics and Microengineering Structures, Devices, and Systems, pp. 320-329 (Jun. 4, 1996).

MacDonald, "SCREAM MicroElectroMechanical Systems" Microelectronic Engineering, 32, pp. 49-73 (1996).

Marxer et al. "Micro-Opto-Mechanical 2 x 2 Switch for Single-Mode Fibers Based on Plasma-Etched Silicon Mirror and Electrostatic Actuation," Journal of Lightwave Technology, vol. 17, No. 1, pp. 2-6 (Jan. 1999).

Michalicek, et al. "Micromirror arrays fabricated by flip-chip assembly", Part of the SPIE Conference on Miniaturized Systems with Micro-Optics and MEMS, Santa Clara, Sep. 1999, SPIE vol. 3878, p. 68-79.

Mihailovich et al.,, "Single-Crystal Silicon Torsional Resonators," School of Electrical Engineering, Cornell University, Ithaca, NY, IEEE, pp. 184-188 (1993).

Neilson et al. Fully provisioned 112*112 micro-mechanical optical crossconnect with 35.8 Tb/s Demonstrated Capacity, Optical Fiber Comm Conferences, vol. 4: 202-204 (Mar. 7-10, 2000).

Rockstad, et al., "A Miniature High-Sensitivity Broadband Accelerometer Based on Electron Tunneling Transducers," Sensors and Actuators A 43, pp. 107-114 (1994).

Roylance et al. "A Batch-Fabricated Silicon Accelerometer," IEEE Transactions on Electron Devices, vol. Ed.-26, No. 12, pp. 1911-1917 (Dec. 1979).

Saif et al. "Planarity of Large MEMs," J. of Microelectromechanical Sys, 5(2): 79-97 (Jun. 1996).

Scotti et al., "The Challenges of Packaging MEMS Components for the All Optical Network of the Future," Design, Test, Integration, and Packaging of MEMS/MOEMS 2001, vol. 4408, pp. 19-27 (Apr. 25-27, 2001).

Shaw, et al., "Scream I: A Single Mask, Single-Crystal Silicon, Reactive lon Etching Process for Microelectromechanical Structures," Sensors and Actuators A, 40 pp. 63-70 (1994).

Tang, et al. "Electrostatic Comb Drive Levitation and Control Method" Journal of Microelectromechanical Systems, vol. 1, No. 4, pp. 170-178 (Dec. 1992).

Webb, et al. "Suspended Thermal Oxide Trench Isolation for SCS MEMS." SPIE vol. 3519, Boston, MA, pp. 196-199, (Nov. 1998).

Wu "MEMS for Optical and RF Applications." UCLA Ectension, Department of Engineering, Information Systems and Technical Management, Engineering: 823.52, Nov. 1-3, 1999.

Wu, et al. "Micromachined Free-Space Integrated Micro-Optics," Sensors and Actuators A, 50, pp. 127-134 (1995).

Yasseen, et al. "A Rotary Electrostatic Mircomotor 1x8 Optical Switch," XP-000829143, Proceedings IEEE of the 11th Annual International Workshop on Micro Electro Mechanical Systems. An Investigation of Micro Structures, Sensors, Actuators, Machines and Systems. Heidelberg, Germany, pp. 116-120 (Jan. 25-28, 1998).

* cited by examiner

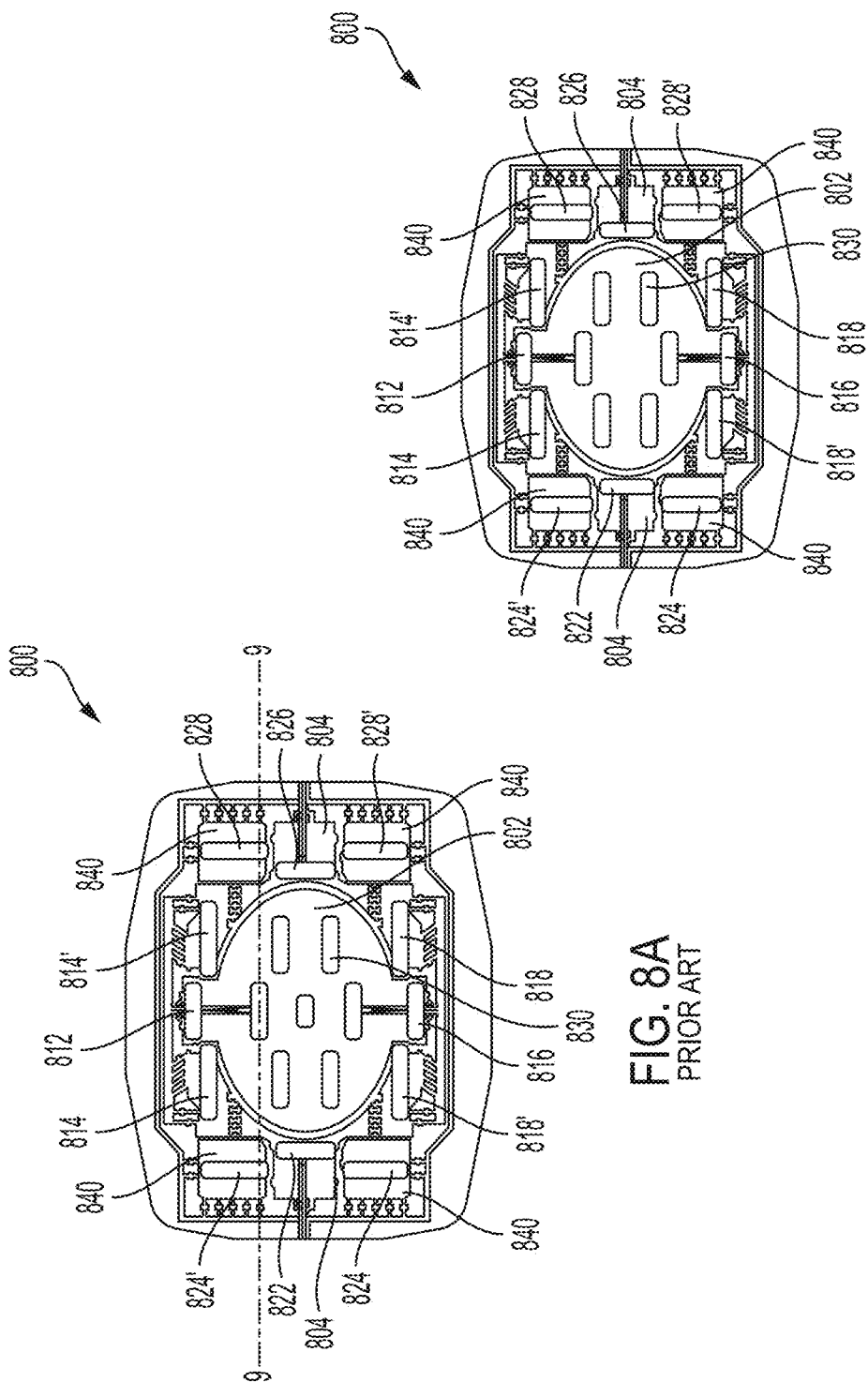

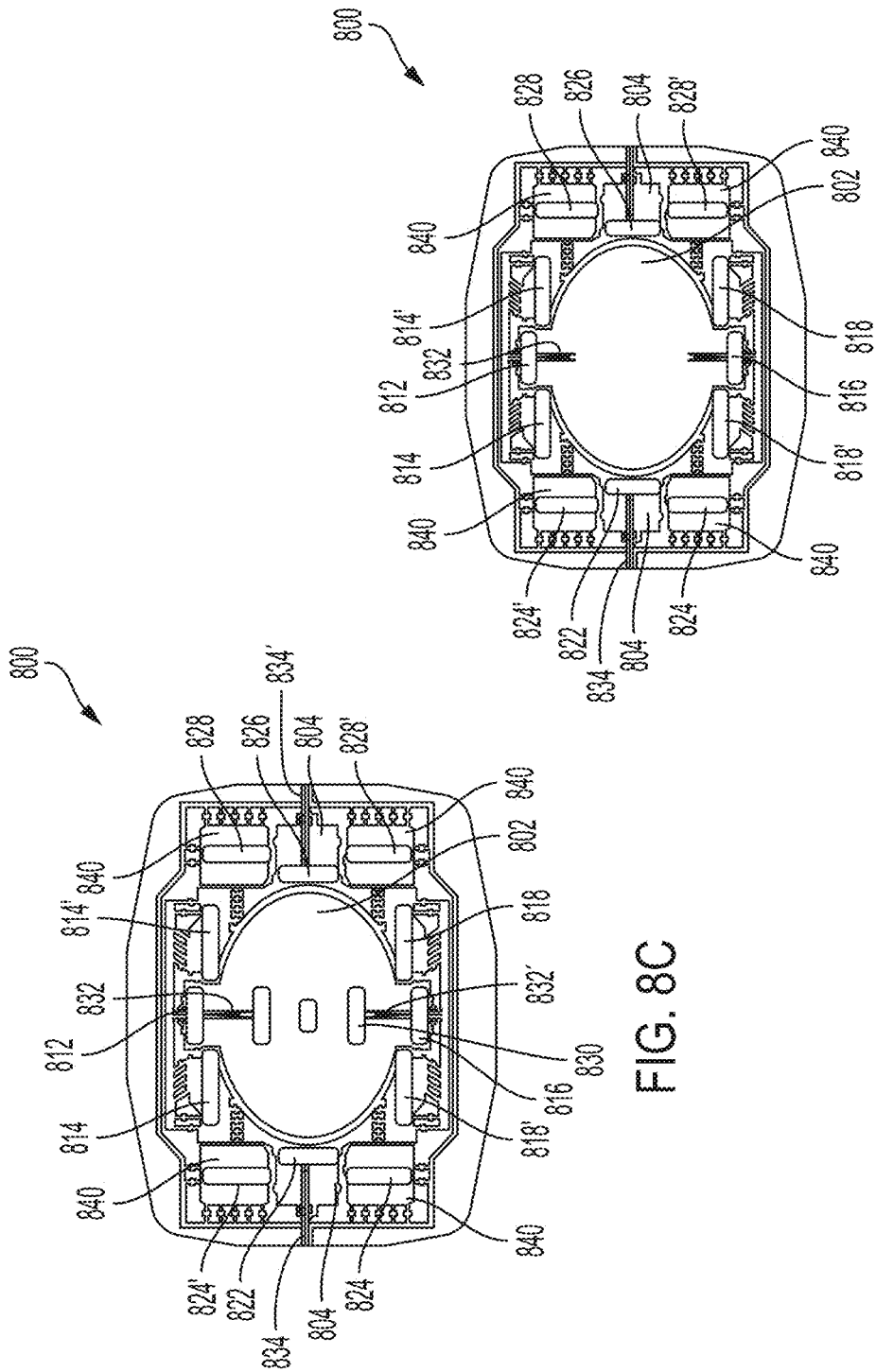

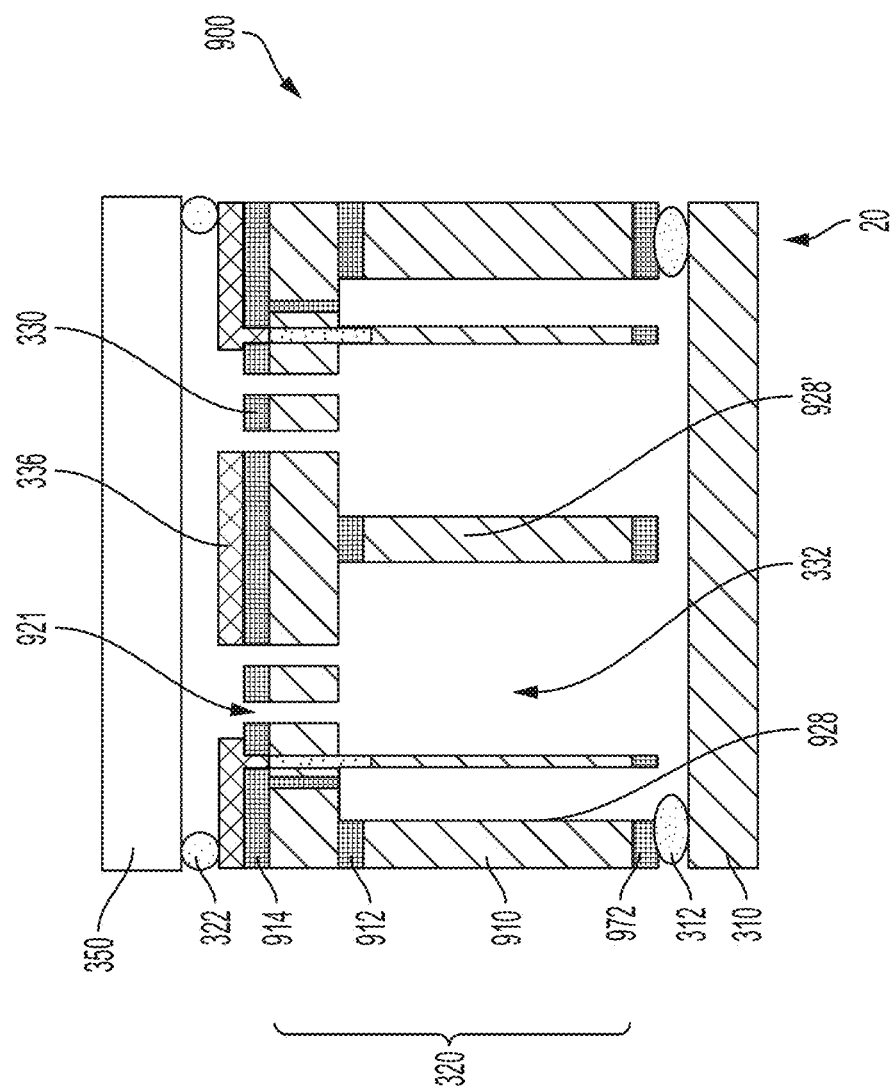

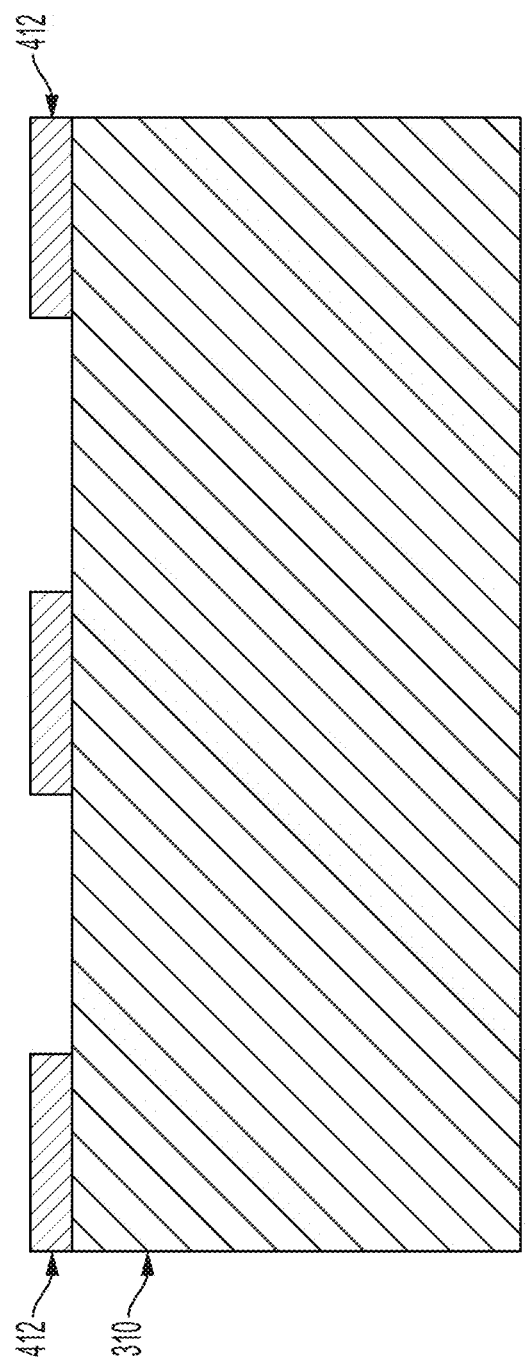

MEMS MIRROR ARRAYS WITH REDUCED CROSSTALK

CROSS-REFERENCE

This application claims the benefit of U.S. Provisional Application No. 63/139,516, filed Jan. 20, 2021, entitled MEMS MIRROR ARRAYS WITH REDUCED CROSSTALK AND METHODS OF MANUFACTURE which application is incorporated herein in its entirety by reference.

BACKGROUND

Microelectromechanical systems (MEMS) and arrays can include parallel-plate actuators designed with gaps that are significantly larger than a stroke range of an actuator. When a voltage is applied between two electrode plates, an attractive force is produced between the electrode plates that rotates plate. The maximum rotation is determined by the gap between the two electrode plates. The larger the separation between the plates, the larger the deflection. Thus, gap is typically much larger than absolutely necessary for the physical movement of electrode plates, because if the electrodes approach too closely to each other (e.g., less than about ⅓ of gap), a point of instability is reached where the electrodes may snap together.

The force produced by a parallel-plate actuator is proportional to $(voltage/gap)^2$. Thus, as the gap increases, the voltage also increases with the square of the distance to achieve the same force. With the movement of the structure, electrode plates do not remain parallel to each other and gap between them decreases. Hence, the voltage required to move electrode plates a given distance is high, nonlinear, and constantly changing. The use of a large gap may result in crosstalk between adjacent actuators in an array.

Additionally, mirror arrays can suffer from crosstalk when one mirror is actuated and one or more adjacent mirrors also move. An example of crosstalk that can occur is shown in FIG. 1 and discussed below.

What is needed are MEMS mirror arrays and methods of manufacturing the arrays that reduce crosstalk between adjacent mirrors in the arrays.

SUMMARY

Disclosed are MEMS mirror arrays and methods of manufacture that reduce crosstalk between adjacent mirrors in the arrays. Additionally, coupling between adjacent mirrors in the array is reduced without changing the normal operation of the mirrors.

An aspect of the disclosure is directed to MEMS arrays. MEMS arrays comprise: a first stage, a first frame pivotally coupled to the first stage, and a first stage reflective surface, wherein the first stage reflective surface has a first resonant frequency; a second stage, a second frame pivotally coupled to the second stage, and a second stage reflective surface, wherein the second stage reflective surface has a second resonant frequency; and a base wafer positioned below the first stage and the second stage, wherein the first stage is adjacent the second stage on the base wafer. The first stage can be operable to be pivotally coupled to the first frame with a pair of first stage flexures and the second stage is pivotally coupled to the second frame with a pair of second stage flexures. Additionally, the first stage flexures and the second stage flexures are can be operable to rotate about a single axis and substantially restrict rotation about other axes, the single axis residing along a length of one or more of the first stage flexures and the second stage flexures. The flexures can also comprise a plurality of torsion beams. Additionally, in some configurations, the plurality of torsion beams can be positioned substantially parallel to one another. In at least some configurations, the torsion beams have a torsion beam length and wherein the plurality of torsion beams are non-parallel along portion of the torsion beam lengths. The MEMS array can further comprise: a first set of one or more first stage blades coupled to the first stage, the first set of one or more first stage blades electrically connected to each other; and a second set of one or more first stage blades coupled to the first stage, the second set of one or more first stage blades electrically connected to each other; and a first set of one or more second stage blades coupled to the second stage, the first set of one or more second stage blades electrically connected to each other; and a second set of one or more second stage blades coupled to the second stage, the second set of one or more second stage blades electrically connected to each other. Additionally, the MEMS array can further comprise: a third stage, a third frame pivotally coupled to the third stage, and a third stage reflective surface, wherein the third stage reflective surface has a third resonant frequency, further wherein the third stage is positioned on the base wafer adjacent the first stage on a first side and the second stage on a second side perpendicular to the first side. In at least some configurations, the MEMS array, further comprises: a fourth stage, a fourth frame pivotally coupled to the fourth stage, and a fourth stage reflective surface, wherein the fourth stage reflective surface has a fourth resonant frequency, further wherein the fourth stage is positioned on the base wafer adjacent at least one of the first stage, the second stage and the third stage. A device wafer can also be provided that is secured to the base wafer by a bonding element. In some configurations, the base wafer further comprises a support anchor in contact with a support webbing, further wherein the contact between the support anchor and the support webbing is operable to dampen mechanical motion of the reflective surface.

Another aspect of the disclosure is directed to methods for fabricating a microelectromechanical (MEMS) array. The fabricating method comprises: forming a layer of dielectric material on a first side of a substrate; forming on the first side of the substrate vertical isolation trenches containing dielectric material; patterning a masking layer on a second side of the substrate that is opposite to the first side of the substrate; forming vias on the first side of the substrate; metallizing the first side of the substrate; depositing a second metal layer on the first side of the substrate to form a reflective surface; forming second trenches on the first side of the substrate to define structures; deeply etching the second side of the substrate to form narrow blades; bonding a base wafer to the second side of the substrate after forming the narrow blades; and etching through the second trenches on the first side of the substrate to release the structures and to provide electrical isolation, wherein the microelectromechanical array has a first stage, a first frame pivotally coupled to the first stage, and a first stage reflective surface, wherein the first stage reflective surface has a first resonant frequency, and a second stage, a second frame pivotally coupled to the second stage, and a second stage reflective surface, wherein the second stage reflective surface has a second resonant frequency. The substrate can comprises a silicon wafer. Additionally, the dielectric material can be silicon dioxide. Additionally the method can include one or more of forming a passivation dielectric layer on the first side of the substrate after metallizing the first side of the substrate and attaching a lid wafer to the first side of the substrate. The lid wafer can also be comprised of glass.

Yet another aspect of the disclosure is directed to a MEMS array, comprising: a first stage, a first frame pivotally coupled to the first stage, and a first stage reflective surface; and a base wafer positioned below the first stage, wherein the base wafer further comprises a support anchor in contact with a support webbing, further wherein the contact between the support anchor and the support webbing is operable to dampen mechanical motion of the reflective surface. In some configurations, the first stage is pivotally coupled to the first frame with a pair of first stage flexures. Additionally, the first stage flexures can be configured to rotate about a single axis and substantially restrict rotation about other axes, the single axis residing along a length of the flexures. The flexures can also comprise a plurality of torsion beams, including torsion beams that are substantially parallel to one another. Furthermore, each of the plurality of torsion beams has a torsion beam length and wherein the plurality of torsion beams are non-parallel along portion of the torsion beam lengths. A first set of one or more first stage blades can be provided that are coupled to the first stage, the first set of one or more first stage blades electrically connected to each other; and a second set of one or more first stage blades coupled to the first stage, the second set of one or more first stage blades electrically connected to each other. Additionally, a device wafer can be secured to the base wafer by a bonding element.

INCORPORATION BY REFERENCE

All publications, patents, and patent applications mentioned in this specification are herein incorporated by reference to the same extent as if each individual publication, patent, or patent application was specifically and individually indicated to be incorporated by reference.

U.S. Pat. No. 3,493,820 A dated Feb. 3, 1970 by Rosvold;
U.S. Pat. No. 4,104,086 A dated Aug. 1, 1978 by Bondur et al.;
U.S. Pat. No. 4,421,381 A dated Dec. 20, 1983 by Ueda et al.;
U.S. Pat. No. 4,509,249 A dated Apr. 9, 1985 by Goto et al.;
U.S. Pat. No. 4,519,128 A dated May 28, 1985 by Chesebro et al.;
U.S. Pat. No. 4,553,436 A dated Nov. 19, 1985 by Hansson;
U.S. Pat. No. 4,571,819 A dated Feb. 25, 1986 by Rogers et al.;
U.S. Pat. No. 4,670,092 A dated Jun. 2, 1987 by Motamedi;
U.S. Pat. No. 4,688,069 A dated Aug. 18, 1987 by Joy et al.;
U.S. Pat. No. 4,706,374 A dated Nov. 17, 1987 by Murakami;
U.S. Pat. No. 4,784,720 A dated Nov. 15, 1988 by Douglas;
U.S. Pat. No. 4,855,017 A dated Aug. 8, 1989 by Douglas;
U.S. Pat. No. 4,876,217 A dated Oct. 24, 1989 by Zdebel;
U.S. Pat. No. 5,426,070 A dated Jun. 20, 1995 by Shaw et al.;
U.S. Pat. No. 5,536,988 A dated Jul. 16, 1996 by Zhang et al.;
U.S. Pat. No. 5,563,343 A dated Oct. 8, 1996 by Shaw et al.;
U.S. Pat. No. 5,610,335 A dated Mar. 11, 1997 by Shaw et al.;
U.S. Pat. No. 5,628,917 A dated May 13, 1997 by MacDonald et al.;
U.S. Pat. No. 5,719,073 A dated Feb. 17, 1998 by Shaw et al.;
U.S. Pat. No. 5,726,073 A dated Mar. 10, 1998 by Zhang et al.;
U.S. Pat. No. 5,770,465 A dated Jun. 23, 1998 by MacDonald et al.;
U.S. Pat. No. 5,846,849 A dated Dec. 8, 1998 by Shaw et al.;
U.S. Pat. No. 5,847,454 A dated Dec. 8, 1998 by Shaw et al.;
U.S. Pat. No. 5,068,203 A dated Nov. 26, 1991 by Logsdon et al.;
U.S. Pat. No. 5,083,857 A dated Jan. 28, 1992 by Hornbeck;
U.S. Pat. No. 5,097,354 A dated Mar. 17, 1992 by Goto;
U.S. Pat. No. 5,172,262 A dated Dec. 15, 1992 by Hornbeck;
U.S. Pat. No. 5,198,390 A dated Mar. 30, 1993 by MacDonald et al.;
U.S. Pat. No. 5,203,208 A dated Apr. 20, 1993 by Bernstein;
U.S. Pat. No. 5,226,321 A dated Jul. 13, 1993 by Varnham et al.;
U.S. Pat. No. 5,235,187 A dated Aug. 10, 1993 by Arney et al.;
U.S. Pat. No. 5,316,979 A dated May 31, 1994 by MacDonald et al.;
U.S. Pat. No. 5,393,375 A dated Feb. 28, 1995 by MacDonald et al.;
U.S. Pat. No. 5,397,904 A dated Mar. 14, 1995 by Arney et al.;
U.S. Pat. No. 5,399,415 A dated Mar. 21, 1995 by Chen et al.;
U.S. Pat. No. 5,427,975 A dated Jun. 27, 1995 by Sparks et al.;
U.S. Pat. No. 5,428,259 A dated Jun. 27, 1995 by Suzuki;
U.S. Pat. No. 5,449,903 A dated Sep. 12, 1995 by Arney et al.;
U.S. Pat. No. 5,454,906 A dated Oct. 3, 1995 by Baker et al.;
U.S. Pat. No. 5,488,862 A dated Feb. 6, 1996 by Neukermans et al.;
U.S. Pat. No. 5,501,893 A dated Mar. 26, 1996 by Laermer et al.;
U.S. Pat. No. 5,611,888 A dated Mar. 18, 1997 by Bosch et al.;
U.S. Pat. No. 5,611,940 A dated Mar. 18, 1997 by Zettler;
U.S. Pat. No. 5,629,790 A dated May 13, 1997 by Neukermans et al.;
U.S. Pat. No. 5,637,189 A dated Jun. 10, 1997 by Peeters et al.;
U.S. Pat. No. 5,645,684 A dated Jul. 8, 1997 by Keller;
U.S. Pat. No. 5,673,139 A dated Sep. 30, 1997 by Johnson;
U.S. Pat. No. 5,703,728 A dated Dec. 30, 1997 by Smith et al.;
U.S. Pat. No. 5,759,913 A dated Jun. 2, 1998 by Fulford Jr et al.;
U.S. Pat. No. 5,798,557 A dated Aug. 25, 1998 by Salatino et al.;
U.S. Pat. No. 5,804,084 A dated Sep. 8, 1998 by Nasby et al.;

U.S. Pat. No. 5,853,959 A dated Dec. 29, 1998 by Brand et al.;
U.S. Pat. No. 5,915,168 A dated Jun. 22, 1999 by Salatino et al.;
U.S. Pat. No. 5,920,417 A dated Jul. 6, 1999 by Johnson;
U.S. Pat. No. 5,933,746 A dated Aug. 3, 1999 by Begley et al.;
U.S. Pat. No. 5,969,848 A dated Oct. 19, 1999 by Lee et al.;
U.S. Pat. No. 5,998,816 A dated Dec. 7, 1999 by Nakaki et al.;
U.S. Pat. No. 5,998,906 A dated Dec. 7, 1999 by Jerman et al.;
U.S. Pat. No. 5,999,303 A dated Dec. 7, 1999 by Drake;
U.S. Pat. No. 6,000,280 A dated Dec. 14, 1999 by Miller et al.;
U.S. Pat. No. 6,020,272 A dated Feb. 1, 2000 by Fleming;
U.S. Pat. No. 6,044,705 A dated Apr. 4, 2000 by Neukermans et al.;
U.S. Pat. No. 6,072,617 A dated Jun. 6, 2000 by Henck;
U.S. Pat. No. 6,075,639 A dated Jun. 13, 2000 by Kino et al.;
U.S. Pat. No. 6,097,858 A dated Aug. 1, 2000 by Laor;
U.S. Pat. No. 6,097,859 A dated Aug. 1, 2000 by Solgaard et al.;
U.S. Pat. No. 6,097,860 A dated Aug. 1, 2000 by Laor;
U.S. Pat. No. 6,101,299 A dated Aug. 8, 2000 by Laor;
U.S. Pat. No. 6,121,552 A dated Sep. 19, 2000 by Brosnihan et al.;
U.S. Pat. No. 6,753,638 A dated Feb. 2, 2001 by Adams et al.;
U.S. Pat. No. 7,098,571 A dated Aug. 29, 2006 by Adams, et al.;
U.S. Pat. No. 7,261,826 B2 dated Aug. 28, 2007 by Adams et al.;
US 2008/190198 A1 dated Aug. 14, 2008 by Prandi et al.;
US 2008/284028 A1 dated Nov. 20, 2008 by Greywall;
US 2009/196623 A1 dated Aug. 6, 2009 by Detry;
US 2010/263998 A1 dated Oct. 21, 2010 by Anderson et al.;
US 2011/018095 A1 dated Jan. 27, 2011 by Booth Jr., et al.;
US 2011/140569 A1 dated Jun. 16, 2011 by Moidu;
US 2012/133023 A1 dated May 31, 2012 by Booth Jr., et al.;
US 2014/014480 A1 dated Jan. 16, 2014 by Anderson et al.
WO 2001/057902 A2 dated Aug. 9, 2001 by Adams et al.;
WO 1994/018697 A1 dated Aug. 18, 1994 by Shaw et al.;
WO 1997/004283 A2 dated Feb. 6, 1997 by Miller et al.; and
WO 1999/036941 A2 dated Jul. 22, 1999 by Adams et al.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings of which:

FIG. 8A illustrates an individual mirror with full loading and frequency ($f_o$);

FIG. 8B illustrates an individual mirror with partial loading and frequency ($f_1$);

FIG. 8C illustrates an individual mirror with partial loading and frequency ($f_2$);

FIG. 8D illustrates an individual mirror with partial loading and frequency ($f_3$);

FIG. 9K illustrates a wafer after a release etch separates portions of the structure and after attachment of a lid wafer; and FIGS. 10A-C illustrate another variation prior to bonding.

DETAILED DESCRIPTION

I. Microelectromechanical (MEMS) Arrays

Figure 1:
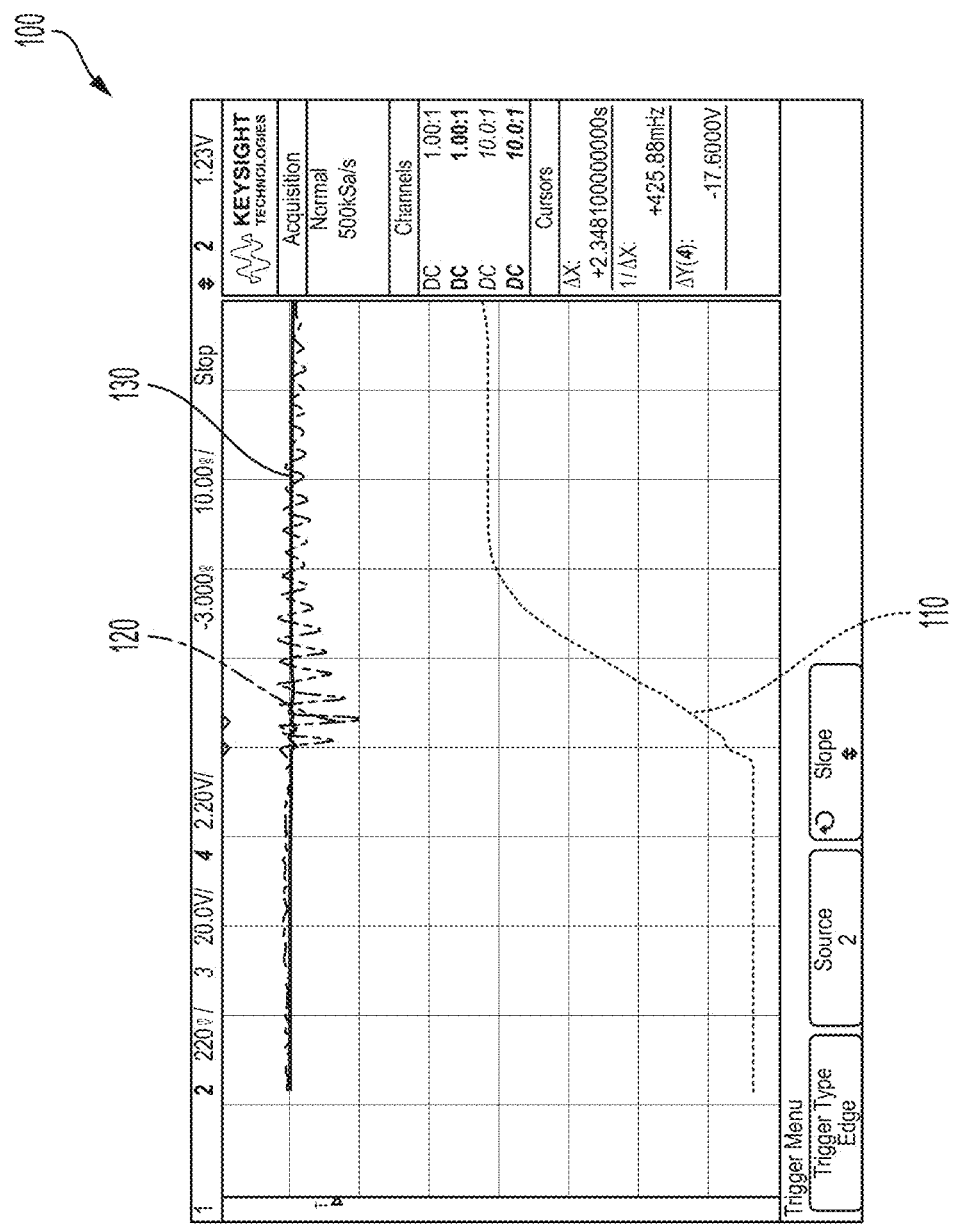
FIG. 1 illustrates an actuation voltage ramping up on a mirror in a MEMS array and undesirable oscillations in an adjacent mirror.

Disclosed are microelectromechanical (MEMS) arrays. The MEMS arrays comprise: a first stage (e.g., stage 802), a first frame (e.g., frame 804) pivotally coupled to the first stage, and a first stage reflective surface (e.g. mirror), wherein the first stage reflective surface has a first resonant frequency (e.g., resonant frequency 502); a second stage, a second frame pivotally coupled to the second stage, and a second stage reflective surface, wherein the second stage reflective surface has a second resonant frequency (e.g., resonant frequency 604); and a base wafer (e.g., silicon wafer 910) positioned below the first stage and the second stage, wherein the first stage is adjacent the second stage on the base wafer. The first stage can be operable to be pivotally coupled to the first frame with a pair of first stage flexures (e.g., central stage flexures 832, 832') and the second stage is pivotally coupled to the second frame with a pair of second stage flexures. Additionally, the first stage flexures and the second stage flexures are can be operable to rotate about a single axis and substantially restrict rotation about other axes, the single axis residing along a length of one or more of the first stage flexures and the second stage flexures.

The flexures can also comprise a plurality of torsion beams. Additionally, in some configurations, the plurality of torsion beams can be positioned substantially parallel to one another. In at least some configurations, the torsion beams have a torsion beam length and wherein the plurality of torsion beams are non-parallel along portion of the torsion beam lengths. The MEMS array can further comprise: a first set of one or more first stage blades (e.g., blade 812) coupled to the first stage, the first set of one or more first stage blades electrically connected to each other; and a second set of one or more first stage blades coupled to the first stage, the second set of one or more first stage blades electrically connected to each other; and a first set of one or more second stage blades coupled to the second stage, the first set of one or more second stage blades electrically connected to each other; and a second set of one or more second stage blades coupled to the second stage, the second set of one or more second stage blades electrically connected to each other. Additionally, the MEMS array can further comprise: a third stage, a third frame pivotally coupled to the third stage, and a third stage reflective surface, wherein the third stage reflective surface has a third resonant frequency, further wherein the third stage is positioned on the base wafer adjacent the first stage on a first side and the second stage on a second side perpendicular to the first side. In at least some configurations, the MEMS array, further comprises: a fourth stage, a fourth frame pivotally coupled to the fourth stage, and a fourth stage reflective surface, wherein the fourth stage reflective surface has a fourth resonant frequency, further wherein the fourth stage is positioned on the base wafer adjacent at least one of the first stage, the second stage and the third stage. A device wafer can also be provided that is secured to the base wafer by a bonding element. In some configurations, the base wafer further comprises a support anchor in contact with a support webbing, further wherein the contact between the support anchor and the support webbing is operable to dampen mechanical motion of the reflective surface.

Another configuration of a MEMS array, comprises: a first stage, a first frame pivotally coupled to the first stage, and a first stage reflective surface, and a base wafer positioned below the first stage, wherein the base wafer further comprises a support anchor in contact with a support webbing, further wherein the contact between the support anchor and the support webbing is operable to dampen mechanical motion of the reflective surface. In some configurations, the first stage is pivotally coupled to the first frame with a pair of first stage flexures. Additionally, the first stage flexures can be configured to rotate about a single axis and substantially restrict rotation about other axes, the single axis residing along a length of the flexures. The flexures can also comprise a plurality of torsion beams, including torsion beams that are substantially parallel to one another. Furthermore, each of the plurality of torsion beams has a torsion beam length and wherein the plurality of torsion beams are non-parallel along portion of the torsion beam lengths. A first set of one or more first stage blades can be provided that are coupled to the first stage, the first set of one or more first stage blades electrically connected to each other; and a second set of one or more first stage blades coupled to the first stage, the second set of one or more first stage blades electrically connected to each other. Additionally, a device wafer can be secured to the base wafer by a bonding element.

Turning now to FIG. 1, an actuation voltage ramping up when an actuation voltage 110 is applied is shown. The actuation voltage 110 ramps-up overtime on a mirror in a MEMS array and undesirable oscillation 120 is detected in an adjacent mirror. One cause for the crosstalk between adjacent mirrors is the mechanical coupling of the supports for each mirror in the MEMS array. The voltage measurement 130 on an adjacent mirror is also illustrated.

Figure 2:
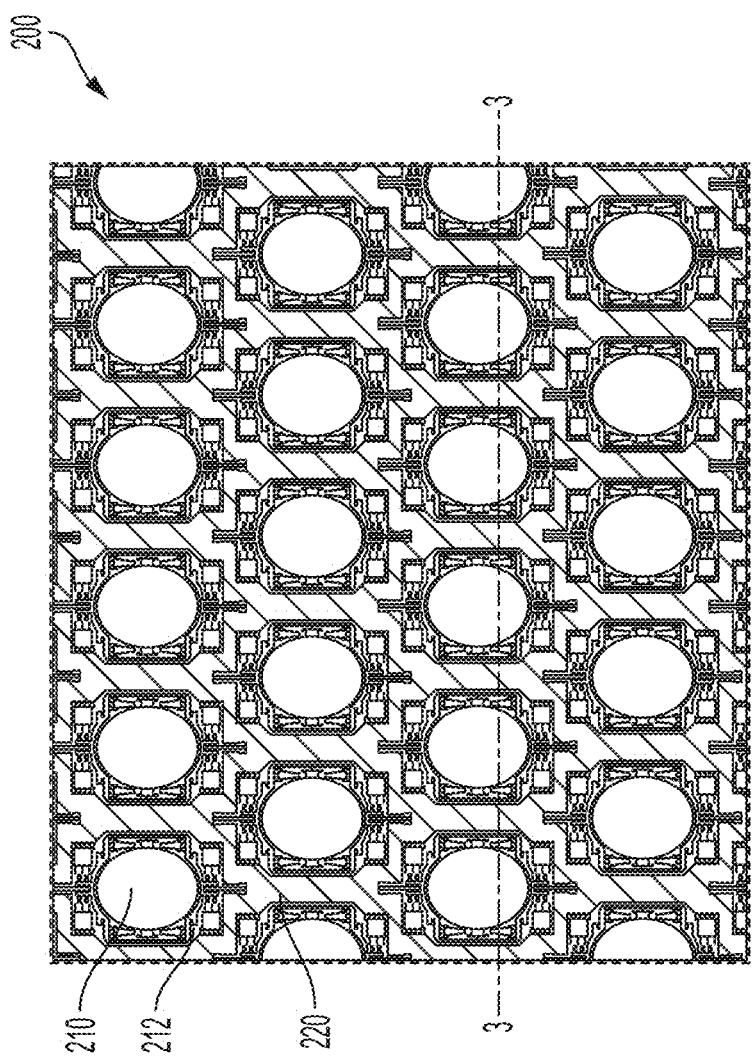
FIG. 2 illustrates a portion of a mirror array.

FIG. 2 illustrates an upper layer view of a portion of a prior MEMS mirror array 200. The MEMS mirror array 200 has a metal layer 210, a mirror cavity 212, and a support 220.

As will be appreciated by those skilled in the art, a MEMS array 200 has multiple stage actuators. Each actuator in an array includes a central stage, a movable frame, and a stationary frame. The stationary frame can form a cavity in which central stage and movable frame are disposed. A reflective element (e.g., a mirror) may be coupled to central stage and suspended from movable frame by a first central stage flexure and a second central stage flexure. The reflective element may be used to redirect a light beam along an optical path different from the optical path of the received light beam. An actuator that includes a mirror on the central stage is also referred to as a mirror cell or a MEM actuator with a mirror.

The rotation of the central stage can be independent of the rotation of movable frame. An actuator thus can allow decoupled motion. For example, central stage can rotate with respect to stationary frame while movable frame remains parallel and stationary with respect to stationary frame. In addition, movable frame can rotate with respect to the stationary frame while central stage remains parallel (and stationary) with respect to the movable frame. The moveable frame couples to the stationary frame via a first stationary frame flexure and a second stationary frame flexure. Furthermore, the central stage and the movable frame can, for example, both rotate concurrently yet independently of each other. Thus, for example, the central stage, movable frame, and stationary frame can concurrently be non-parallel and decoupled with respect to each other during actuation.

The first central stage flexure and the second central stage flexure are coupled to the movable frame via a first end bar and a second end bar. The first end bar and the second end bar are, in turn, attached to the main body of movable frame using multiple support members. Support members are silicon dioxide beams providing a tensioning force. The support members provide a tensioning force by expanding a different amount than the material system used in moveable frame, central stage, first end bar, second end bar, and stationary frame. Material systems of differing expansion can be placed into the movable frame in order to put the first central flexure and the second central flexure into tension. In particular, the expansion provided by connection members acting against the moveable frame and the first and second end bars causes a tensioning force on each pair of the central stage flexure and the stationary frame flexure. Support members serve to apply a tension force in order to minimize the potential for positional distortions due to buckling of the flexures under compressive forces. Generally, if any of the flexures are under too great a compressive force, the flexures may buckle. As such, support members may be coupled between the main body of movable frame and first and second end bars at a non-perpendicular angle in order to pull on central stage flexures to place them in tension. Because stationary frame flexures are perpendicular to central stage flexures, the non-perpendicular angle of attachment of support members causes a pull on the main body of movable frame and, thereby, a pull on and a tensioning of stationary frame flexures.

Support members may be coupled between the main body of movable frame and the first and second end bars can be positioned at approximately a 45 degree angle. Alternatively, support members may be coupled between the main body of movable frame and the first and second end bars at an angle less than or greater than 45 degrees.

Central stage flexures allow the central stage to pivot. Central stage flexures also provide some torsional resistance proportional to the rotation angle, but substantially less resistance than all other directions. In other words, there is substantial resistance to undesired twisting movement of central stage in other directions (e.g., side-to-side, or around an axis perpendicular to the surface of central stage). Moreover, central stage flexures extend into a corresponding slot formed in the central stage in order to provide sufficient length to the flexures for appropriate flexibility and torsion resistance. The central stage flexures may have a length of approximately 100 microns, a height of approximately 10 microns, and a width of approximately 1 micron, resulting in a 10:1 aspect ratio. Such an aspect ratio may provide for greater compliance in the direction of desired motion and stiffness in the undesired directions. In an alternative embodiment, other lengths, heights, widths, and aspect ratios may be used.

Similarly, stationary frame flexures enable the movable frame to pivot while providing resistance to undesired twisting movement of movable frame in other directions (e.g., side-to-side, or around an axis perpendicular to the surface of movable frame). Stationary frame flexures extend into slots a pair of corresponding slots formed into movable frame and stationary frame in order to provide sufficient length to the flexures for appropriate flexibility and torsion resistance.

One or more of the central stage flexures and stationary frame flexures may comprise a pair of torsion beams. The torsion beams can have a length with a plurality of torsion beams that are non-parallel along the lengths. The use of multiple torsion beams may provide for increased resistance to undesired twisting movement of a frame or stage, as compared to a single beam flexure. A pair of torsion beams may have various configurations. Torsion beams may be non-parallel beams with ends near the movable frame are substantially parallel and spaced apart by a gap. The gap between torsion beams reduces along the length of the beams such that the ends of the beams near fixed frame are closer together than the ends of the beams near movable frame. The angling of torsion beams relative to each other may aid flexure to resist unstable twisting modes. In an alternative embodiment, torsion beams may be configured such that their ends near fixed frame are farther apart than their ends near movable frame. In yet another embodiment, torsion beams may be substantially parallel to each other such that gap is substantially uniform along the length of the beams.

Figure 3:
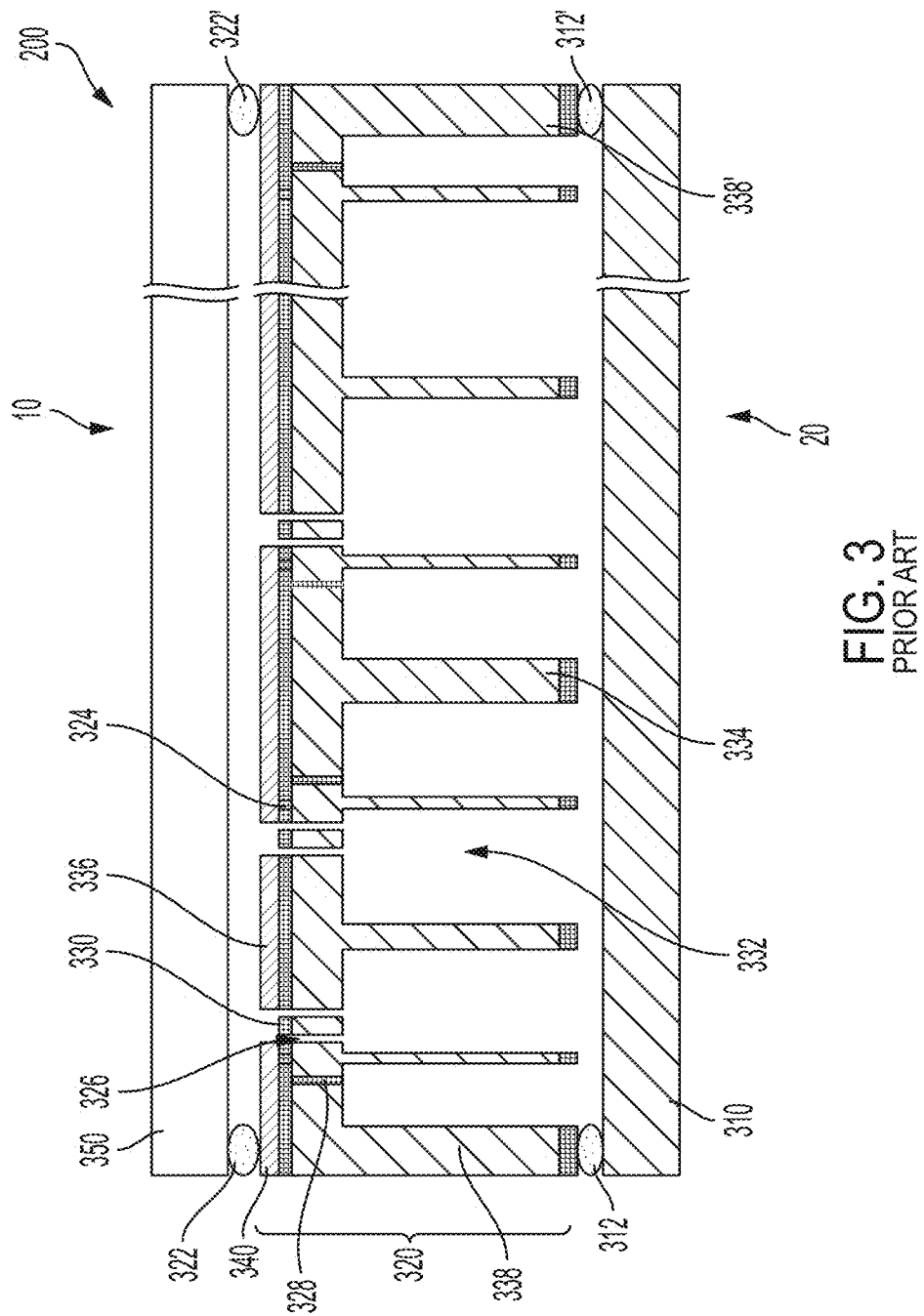
FIG. 3 illustrates a cross-section of a prior art mirror array taken along the lines 3-3 in FIG. 2.

FIG. 3 illustrates a partial cross-section of a prior MEMS mirror array 200 taken along the lines 3-3 in FIG. 2 with a top side 10 and a bottom side 20 where each layer within the MEMS mirror array 200 has a layer top surface oriented towards top side 10 and a bottom surface oriented towards bottom side 20. The array has a silicon wafer 310, which is a base wafer for the array, and a lid wafer 350 which acts as a protective layer. The base wafer 310 has a first pair of bonding elements 312, 312' which are a frit glass seal at either end of the base wafer layer which bonds the silicon wafer 310 to the device wafer 320. The bonding elements 312, 312' can provide a hermetic seal when bonded. The bonding elements 312, 312' are located along the perimeter of the mirror array such that the entire mirror array is suspended above the silicon wafer 310. A second pair of bonding elements 322, 322' bond the device wafer 320 to the lid wafer 350.

Structure release is accomplished at the upper surface (e.g., top side 10) of the device wafer 320 using dry etching, which punctures through a plurality of trenches 326 to suspend the movable elements of the mirror 336 and the frame 330. Isolation joints 328 are also created by etching the front until the etch approaches or just reaches the bottom of the isolation joint 328. In addition, the release etch promotes electrical isolation by separating, for example, the silicon of the frame 330 from the silicon of surrounding members 338, 338'. The vias 324 serve to connect the regions of silicon to the metal interconnects 340. To completely seal the mirrors from the outside environment, a lid wafer 350 is bonded to the device wafer 320, for example through the second pair of bonding elements 322, 322' which are a frit glass seal. The lid wafer 350 is typically glass to allow incoming light to be transmitted with low loss in the mirror cavity 332, reflect off of the upper surface of mirror 336, and transmit out of the mirror cavity.

Figure 4:
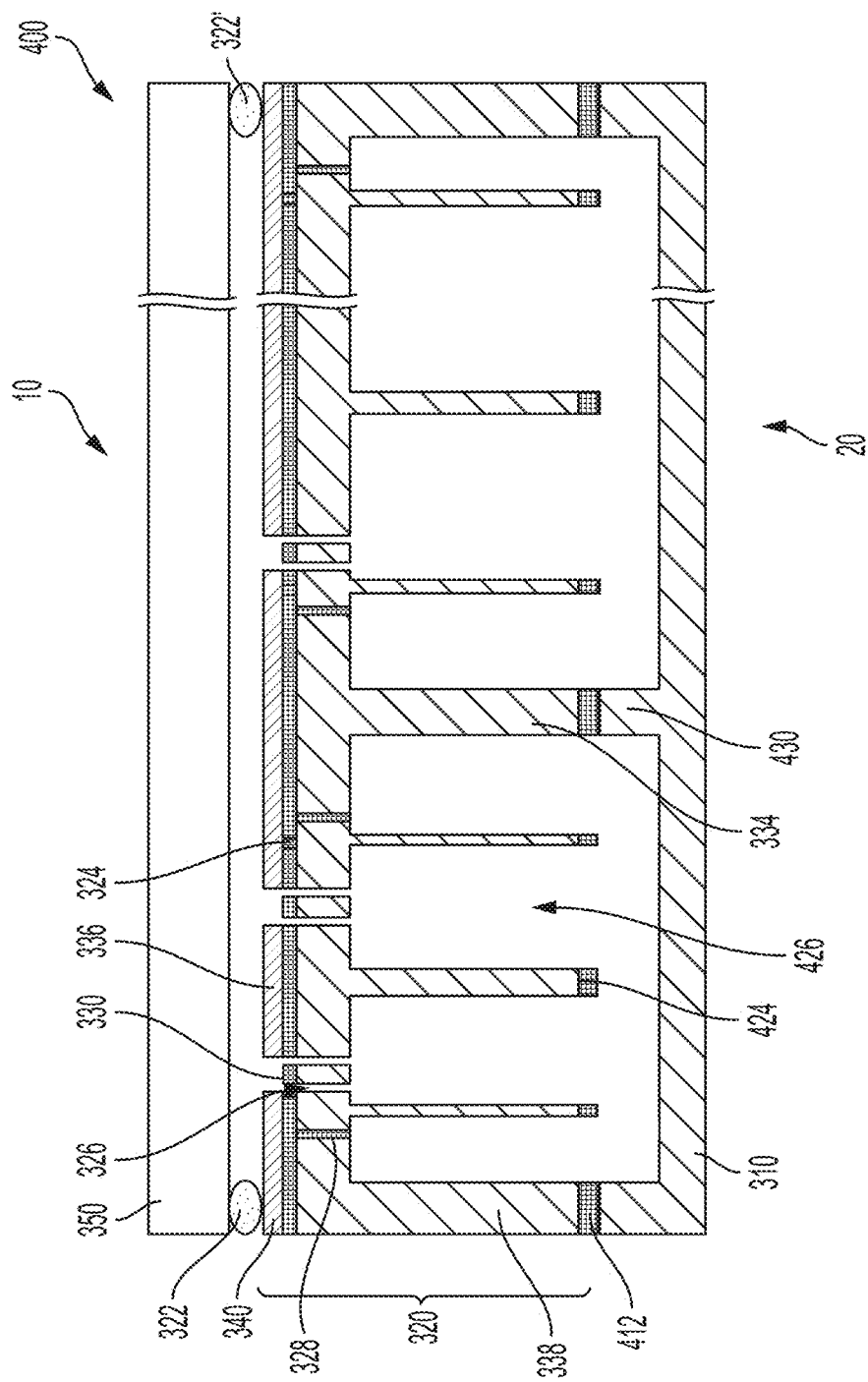
FIG. 4 illustrates a cross-section of a fusion bonded mirror array with support anchors.

FIG. 4 illustrates a partial cross-section of a fusion bonded MEMS mirror array 400 with support anchors 430. The MEMS mirror array 400 has a top side 10 and a bottom side 20 where each layer within the MEMS mirror array 400 has a layer top surface oriented towards top side 10 and a bottom surface oriented towards bottom side 20. The use of support anchors 430 eliminates, or substantially eliminates, mirror crosstalk around each mirror. The support anchors 430, or support pillars, are created by etching pillars or posts having a height of 10-100 um into the silicon wafer 310. The silicon wafer 310 is bonded to the device wafer 320 using, for example, eutectic bonding, thermocompression bonding, fusion bonding or anodic bonding. During the boding process, the support anchors 430 contact the support webbing 334. In some configurations, the support anchors 430 bond to the support webbing 334. In other configurations, the support anchors 430 are in contact with the support webbing 334. Bonding or contact between the support anchors 430 and the support webbing 334 dampens any coupled mechanical motion from the mirrors 336 through their common anchors.

The mirror cell (not shown) cuts across four blades and three suspended sections of the mirror cell. A bond and polish sequence is used to tune the depth of the blades to a value substantially less than the thickness of a normal wafer. Because thinner wafers are fragile and subject to significant handling loss, the base wafer is used early in the process to provide handling support. The moveable blades 424 are patterned and etched using deep silicon etching techniques into the device wafer 320 at the beginning of the process. The depth of the blade trench 426 is tunable and depends on design, swing, and actuator deflection requirements. The blade depth may be 200 um, for example. A silicon wafer 310 can then be fusion bonded to the device wafer 320 at a bonding interface of the masking layer 412. The fusion bonding process directly bonds silicon to silicon or silicon oxide and requires a high temperature anneal to form a strong bond. A recess is etched into the silicon wafer 310 to provide space for the moveable blades 424 to rotate.

Figure 5:
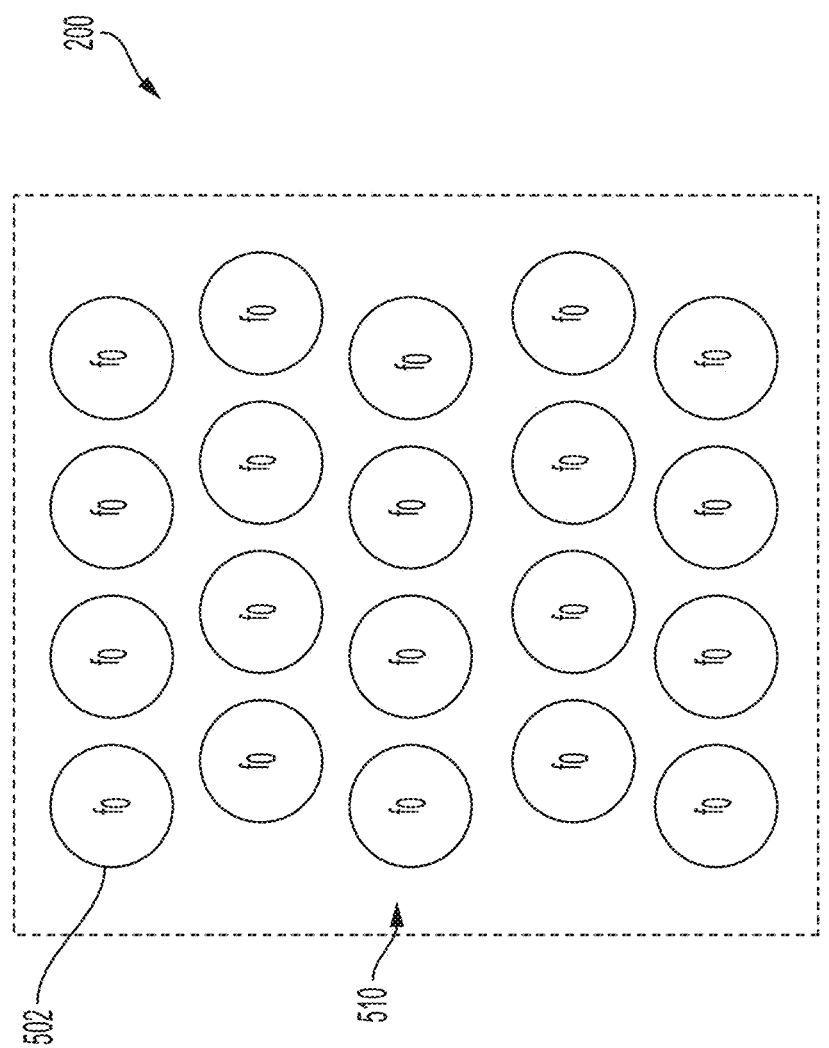
FIG. 5 illustrates a current frequency distribution in an array.
Figure 6:
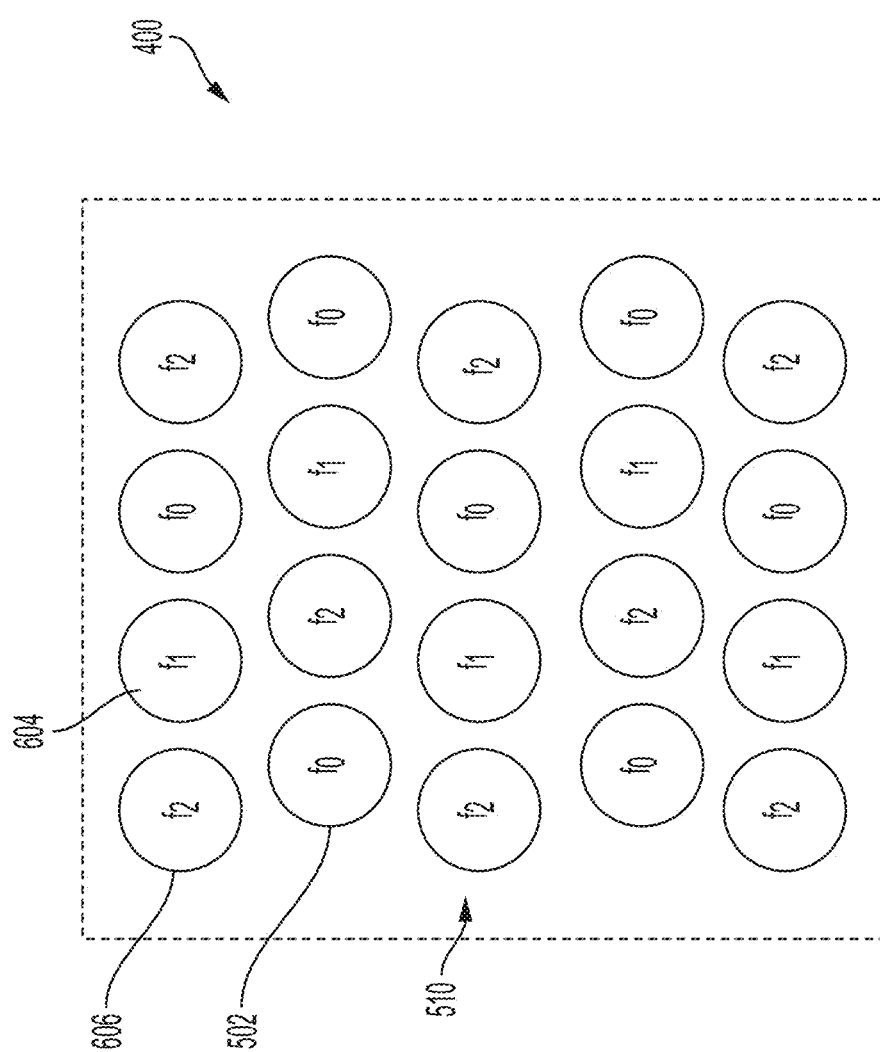
FIG. 6 illustrates a proposed frequency distribution in an array.
Figure 7:
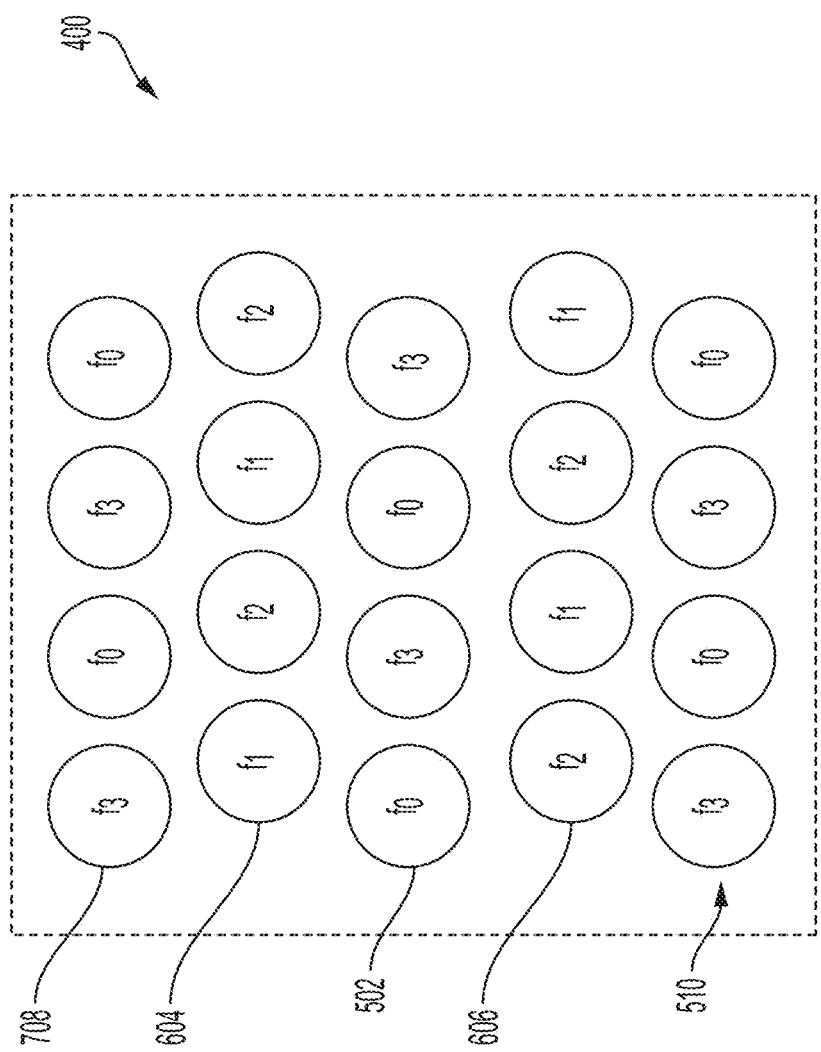
FIG. 7 illustrates a second proposed frequency distribution in an array.

FIGS. 5-7 illustrate current frequency distributions in a portion of a prior MEMS mirror array 200, and MEMS mirror array 400 having a plurality of mirrors 510. Coupling between adjacent mirrors can be reduced by increasing the frequency separation between adjacent mirrors (detuning). MEMS mirror array 400 provide for all mirrors in an array to be identical which results in all mirrors resonating at the same frequency ($f_0$) 502 as shown in FIG. 5. Motion of one mirror 502 at resonance can excite a resonant response in an adjacent mirror.

If adjacent mirrors had different resonant frequencies, such as the layouts in FIGS. 6 and 7, then mechanical coupling would be off-resonance and less efficient. FIGS. 6-7 illustrate potential layouts where three or more resonant frequencies are used. In FIG. 6 a first mirror with a resonant frequency ($f_0$) 502 is adjacent a mirror with a resonant frequency ($f_1$) 604 on one side another mirror with a resonant frequency ($f_2$) 606 on the opposing side. In a first row, resonant frequency ($f_2$) 606 is adjacent a mirror with a resonant frequency ($f_1$) 604 which is followed by a mirror with a resonant frequency ($f_0$) 502. In a second row, below the first row, resonant frequency ($f_0$) 502 is adjacent a mirror with a resonant frequency ($f_2$) 606 which is followed by a mirror with a resonant frequency ($f_1$) 604. The sequence within a row and across the number of rows then repeats as many times as desired.

In FIG. 7 the mirrors are organized in a first row alternating a mirror with a resonant frequency ($f_3$) 708 adjacent a mirror with a resonant frequency ($f_0$) 502. These two resonant frequencies repeat in an alternating fashion across the row. A second row provides a mirror having a resonant frequency ($f_1$) 604 adjacent a mirror having a resonant frequency ($f_2$) 606. A third row has resonant frequency ($f_0$) 502 followed by a mirror with a resonant frequency ($f_3$) 708. These three rows with repeating pairs of alternating mirrors then repeats. The resulting organization achieves a similar result to the organization in FIG. 6, with a greater position distance between two resonant frequencies.

As will be appreciated by those skilled in the art, a given row does not necessarily need to start with a particular resonant frequency (e.g., as illustrated herein) and the examples herein are by way of illustration only. The resulting organization results in a configuration where any mirror adjacent any other individual mirror does not have the same resonant frequency. Moreover, additional rows and combinations of resonant frequencies can be employed without departing from the scope of the disclosure provided mirrors in the array are configured so that at least one neighboring mirror does not share the same resonant frequency. Since resonant frequency is proportional to stiffness and mass, mirror designs with different frequencies can be created by changing one or more of stiffness and/or mass. Keeping stiffness the same and changing only mass, actuation characteristics (angle moved vs. voltage applied) can remain consistent among all mirror designs in an array.

FIGS. 8A-8D are individual MEMS mirrors with resonant frequencies used in the layouts illustrated in FIGS. 5-7. FIG. 8A can be considered an individual MEMS mirror with full loading and frequency ($f_0$); FIG. 8B can be considered an individual MEMS mirror with partial loading and frequency ($f_1$); FIG. 8C can be considered an individual MEMS mirror with partial loading and frequency ($f_2$); and FIG. 8D can be considered an individual MEMS mirror with partial loading and frequency ($f_3$). As will be appreciated by those skilled in the art, the assignment of frequency, e.g. ($f_1$), ($f_2$), and ($f_3$), is arbitrary.

FIG. 8A illustrates a prior art individual MEMS mirror with full loading and frequency ($f_0$). At each end of a stage or frame, actuator 800 uses a single movable blade such as moveable blade 424 in FIG. 4, with two corresponding fixed blades as an actuation mechanism structure to enable rotation. Actuator 800 uses two such actuation mechanism structures per stage and two such actuation mechanism structures per frame. A plurality of blades are provided. A first blade 812 is coupled to central stage 802 and is flanked on either side by a pair of first flanking blades 814, 814' which are coupled to moveable frame 804 on opposite ends of first blade 812. Central stage 802 is pivotally coupled to moveable frame 804 such that first blade 812 is configured to move relative to first flanking blades 814, 814'. When a potential difference is applied between first blade 812 and one of the first flanking blades 814, 814', an attraction is generated between the blades causing central stage 802 to pivot. For example, first blade 812 may be held at a ground potential while an active voltage is applied to either of the first flanking blades 814, 814'. The application of an active voltage to first flanking blade 814, for example, will attract the first blade 812, thereby causing central stage 802 to rotate in a corresponding direction. Similarly, the application of an active voltage to first flanking blade 814' will attract first blade 812 and cause stage 802 to rotate in an opposite direction to that resulting from the attraction to first flanking blades 814.

A second blade 816 is coupled on end of central stage 802 opposite the location of the first blade 812, with a pair of second side flanking blades 818, 818' coupled to moveable frame 804 on opposite ends of second blade 816. Second blade 816 moves relative to second side flanking blades 818, 818'. In order to provide the desired motion of central stage 802 and to resist unwanted rotations, actuation voltages are applied concurrently with respect to first blade 812 and second blade 816. When the potential difference is applied between the second blade 816 and one of second side flanking blades 818, 818', an attraction is generated between the blades resulting in the rotation of central stage 802 in a manner similar to that discussed above with respect to the first blade. The use of actuation mechanisms in tandem on each end of central stage 802 minimizes undesired twisting of the central stage 802 to provide for more uniform rotation.

A similar actuation mechanism structure may be used for rotation of moveable frame 804. For example, a first side blade 822 is coupled to moveable frame 804 and first side flanking blades 824, 824' are coupled to stationary frame 840 on opposite ends of first side blade 822.

Moveable frame 804 is pivotally coupled to stationary frame 840 such that first side blade 822 is configured to move relative to first side flanking blades 824, 824'. When a potential difference is applied between the first side blade 822 and one of the first side flanking blades 824, 824', an attraction is generated between the blades causing the moveable frame 804 to pivot in a manner similar to that discussed above in relation to central stage 802.

Second side blade 826 is coupled on the opposite end of moveable frame 804, with second side flanking blades 828, 828' coupled to stationary frame 840 on opposite ends of second side blade 826. Second side blade 826 moves relative to second side flanking blades 828, 828'. When the potential difference is applied between second side blade 826 and one of second side flanking blades 828, 828', an attraction is generated between the blades facilitating the rotation of moveable frame 804. The use of actuation mechanisms in tandem on each end of moveable frame 804 minimizes undesired twisting of the frame to provide for more uniform rotation.

Alternatively, a central stage 802 or frame may only have an actuation mechanism structure on only a single end. For another embodiment, actuator 800 may have other actuation mechanism structures without departing from the scope of the disclosure.

For one embodiment, a plurality of elongated members 830 can be provided (e.g., elongated member 830) which are coupled to the undersurface of central stage 802 to stiffen the central stage 802 and minimize top surface distortions. In addition, elongated members 830 on central stage 802 may be used to remove etch depth variations across the device. Elongated member 830 may be constructed similar to that of blades discussed herein. FIG. 8A illustrates seven elongated members 830 where six of the elongated members have substantially the same length and are positioned off-center on the central stage 802, and the seventh elongated member has a shorter length and is positioned centrally on the central stage 802.

Because the actuation mechanism of actuator 800 is located entirely beneath the central stage 802 to be rotated, none of the top surface areas of central stage 802 need be taken up by the actuation mechanism.

For one embodiment, actuator 800 may be fabricated on a wafer level using semiconductor fabrication techniques, as discussed below. For such an embodiment, stationary frame 840 may be formed from a substrate, for example, constructed from silicon. Where all blades are directly driven by different control voltages, actuator 800 may use four voltages, plus a ground. With this arrangement, the number of conductive paths on a substrate quickly becomes very large as multiple actuators are combined to form an array. The low voltages required by the blade actuators discussed herein may allow for control circuitry to be fabricated into the substrate so that only control signals need be routed, rather than separate lines for each blade. This results in a significant reduction in lead count. Lower voltages may also reduce the necessity for spacing between leads to avoid arcing and crosstalk.

The central stage 802 for each actuator 800 in an array has a moveable frame 804, and a stationary frame 840. The stationary frame 840 can form a cavity in which central stage 802 and moveable frame 804 are disposed. A reflective element (e.g., a mirror) may be coupled to central stage 802 and suspended from moveable frame 804 by a first central stage flexure 832 and a second central stage flexure 832'. The reflective element may be used to redirect a light beam along an optical path different from the optical path of the received light beam. As noted above, an actuator 800 that includes a mirror on the central stage is also referred to as a mirror cell or a MEM actuator with a mirror.

The moveable frame 804 engages the stationary frame 840 via a first stationary frame flexure 834 and a second stationary frame flexure 834'. Furthermore, the central stage 802 and the moveable frame 804 can, for example, both rotate about a single axis concurrently yet independently of each other. Thus, for example, the central stage 802, moveable frame 804, and stationary frame 840 can concurrently be non-parallel and decoupled with respect to each other during actuation.

The first central stage flexure 832 and the second central stage flexure 832' are coupled the moveable frame 804 via a first end bar and a second end bar. The first end bar and the second end bar are, in turn, attached to the main body of moveable frame 804 using multiple support members. Support members are silicon dioxide beams providing a tensioning force. The support members provide a tensioning force by expanding a different amount than the material system used in moveable frame 804, central stage 802, first end bar, second end bar, and stationary frame 840.

FIG. 8B illustrates an individual mirror (reflective surface) similar to FIG. 8A with partial loading and frequency ($f_1$). FIG. 8B illustrates four elongated members 830 each of which have substantially the same length and are positioned off-center on the central stage 802, such that the elongated members are positioned in a corner of a square or rectangular space on the central stage 802. The reflective surface is positioned on a stage (e.g., a first stage, a second stage, a third stage, etc.).

FIG. 8C illustrates an individual mirror similar to FIG. 8A with partial loading and frequency ($f_2$). FIG. 8C illustrates three elongated members 830 two of which have substantially the same length and are positioned aligned off-center on the central stage 802. The third elongated member has a length less than the other two elongated members and is positioned centrally or substantially centrally on the central stage 802.

FIG. 8D illustrates an individual mirror similar to FIG. 8A with partial loading and frequency ($f_3$). FIG. 8D has no elongated members 830 on the central stage 802.

Turning back to FIGS. 5-7, the array in FIG. 5 would be comprised of a plurality of rows featuring the actuator 800 of FIG. 8A. FIG. 6 would have a first row, for example, of actuator 800 of FIG. 8C followed by the actuator 800 of FIG. 8B, and then actuator 800 of FIG. 8A, with the sequence repeating across the row as often as desired. The second row would have actuator 800 of FIG. 8A followed by actuator 800 of FIG. 8C, and then actuator 800 of FIG. 8B, with the sequence repeating across the row as often as desired. The third row would then repeat the order of row one and row four would repeat the order of row two. FIG. 7 would have a first row, for example, of actuator 800 of FIG. 8D followed by the actuator 800 of FIG. 8A, with the sequence repeating across the row as often as desired. The second row would have actuator 800 of FIG. 8B followed by actuator 800 of FIG. 8C, with the sequence repeating across the row as often as desired. The third row would have actuator 800 of FIG. 8A followed by actuator 800 of FIG. 8D, with the sequence repeating across the row as often as desired. The remaining rows would repeat the sequence in rows one through three.

A number of techniques can be used to fabricate actuator 800 shown in FIGS. 8A-D. The techniques discussed with respect to FIGS. 9A-K are associated with the view provided by cross-section line 9-9 in in FIG. 8A. The fabrication methods of embodiments of the disclosure result in a mirror platform suspended by cantilevered silicon beams. Electrical isolation between sections of the mirror or between different blades is achieved through the use of integral isolation segments, which serve to mechanically connect but electrically isolate separate elements of the mirror.

A design parameter for the mirror actuator is the depth of the blades, measured perpendicular to the axis of rotation. Increasing the blade depth results in increased force, but requires more swing space to rotate through high angles. Shallower blades more easily accommodate higher deflections but usually require a greater number of blades in order to achieve the same force. Therefore, it is advantageous to have several blade depths available to the designer. Different blade depths require multiple approaches to the fabrication process, which are described herein.

II. Methods of Manufacture

The methods for fabricating a microelectromechanical (MEMS) array. The fabricating method comprises: forming a layer of dielectric material on a first side of a substrate; forming on the first side of the substrate vertical isolation trenches containing dielectric material; patterning a masking layer on a second side of the substrate that is opposite to the first side of the substrate; forming vias on the first side of the substrate; metallizing the first side of the substrate; depositing a second metal layer on the first side of the substrate to form a reflective surface; forming second trenches on the first side of the substrate to define structures; deeply etching the second side of the substrate to form narrow blades; bonding a base wafer to the second side of the substrate after forming the narrow blades; and etching through the second trenches on the first side of the substrate to release the structures and to provide electrical isolation, wherein the microelectromechanical array has a first stage, a first frame pivotally coupled to the first stage, and a first stage reflective surface, wherein the first stage reflective surface has a first resonant frequency, and a second stage, a second frame pivotally coupled to the second stage, and a second stage reflective surface, wherein the second stage reflective surface has a second resonant frequency. The substrate can comprises a silicon wafer. Additionally, the dielectric material can be silicon dioxide. Additionally the method can include one or more of forming a passivation dielectric layer on the first side of the substrate after metallizing the first side of the substrate and attaching a lid wafer to the first side of the substrate. The lid wafer can also be comprised of glass.

One embodiment of the invention uses a single device wafer and the associated method is set forth with reference to FIGS. 9A-9K.

Figure 9A:
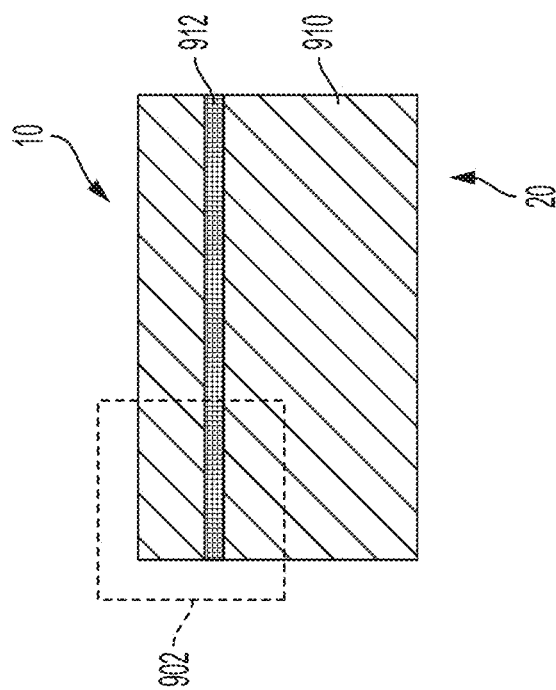
FIG. 9A illustrates a cross-section of a silicon wafer.

FIG. 9A illustrates a cross-section of a silicon on insulator (SOI) wafer 910 that is chosen to be in the thickness range of 300-600 micrometers (um). The silicon wafer 910 has a top side 10 (or device side or simply a top) and a backside or bottom side 20. Each layer within the MEMS mirror array 900 formed from the silicon wafer 910 has a layer top surface oriented towards top side 10 and a bottom surface oriented towards bottom side 20. The upper left hand portion 902 is marked. In the preferred embodiment, the buried oxide layer 912 is 0.5-1 um thick and located 10-50 um beneath the top side 10.

FIGS. 9B-9E illustrate the upper left hand portion 902 of the silicon wafer 910 in a MEMS mirror array 900 which illustrates fabrication techniques for of isolation trenches 920 on the top side 10 of silicon wafer 910. The isolation trenches 920 are vertically positioned on the silicon wafer substrate and filled with a dielectric material, which for one embodiment is silicon dioxide. Once filled, the isolation trenches 920 provide electrical isolation between blades after the mirror is released. A layer 914 also remains on the surface of the silicon wafer 910 and is planarized after the isolation trench fill process to ease subsequent lithographic patterning and eliminate surface discontinuities.

Figure 9B:
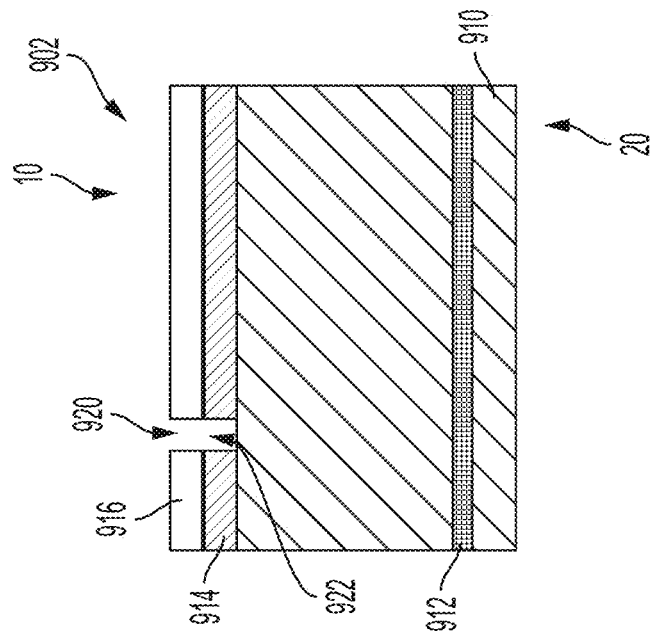
FIG. 9B illustrates a portion of a wafer with a masking layer, photo-resistant layer, and an opening to the silicon surface of the wafer.

Referring to FIG. 9B, a silicon wafer 910 is provided with a masking layer 914. The masking layer 914 can be silicon dioxide (e.g., an oxide layer). The silicon wafer 910 can be of arbitrary doping, resistivity, and crystal orientation, because the process depends only on reactive ion etching to carve and form the structures. The masking layer 914 serves the function of protecting the upper surface of the silicon wafer 910 during the isolation trench etching process, and thus represents a masking layer. This masking layer can be formed from any number of techniques, including thermal oxidation of silicon or chemical vapor deposition (CVD). The typical thickness of the masking layer 914 is 0.5-1.0 um. A photoresist layer 916 is then spun onto the silicon wafer 910 and exposed and developed using standard photolithography techniques to define the isolation trench pattern for the isolation trench 920. Reactive ion etching is used to transfer the photoresist pattern to the masking layer 914, exposing the top surface of the silicon wafer 910 (i.e., the bottom 922 of the isolation trench 920). Typically, the silicon dioxide mask is etched in Freon gas mixture, for example $CHF_3$ or $CF_4$. High etch rates for silicon dioxide etching are achieved using a high density plasma reactor, such as an inductively coupled plasma ("ICP") chamber. These ICP chambers use a high power RF source to sustain the high density plasma and a lower power RF bias on the wafer to achieve high etch rates at low ion energies. Oxide etch rates of 200 nm/min and selectivities to photoresist greater than 1:1 are common for this hardware configuration.

Figure 9D:
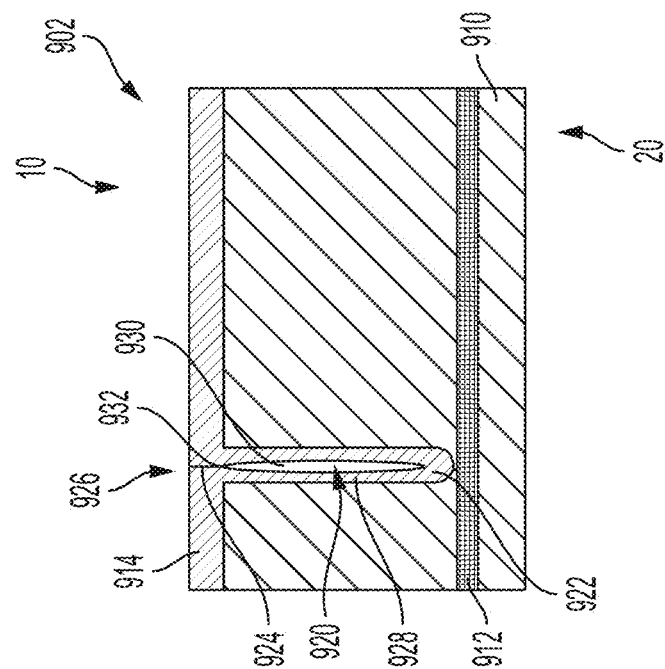
FIG. 9D illustrates a portion of a wafer with a dielectric layer on the top surface of the silicon wafer and on the sidewalls and bottom of the isolation trench.
Figure 9C:
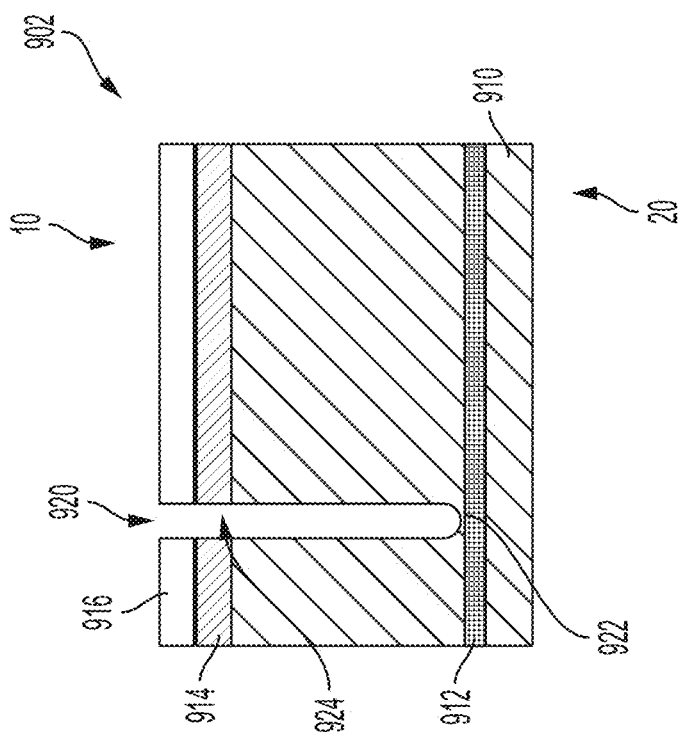
FIG. 9C illustrates an isolation trench formed in a silicon wafer.

As illustrated in FIG. 9C, an isolation trench 920 is formed in the silicon wafer 910 by deep reactive ion etching of silicon using high etch rate, high selectivity etching. The trench is commonly etched in a high-density plasma using a sulfur hexafluoride ($SF_6$) gas mixture as described in U.S. Pat. No. 5,501,893. Preferably, etching is controlled so that the isolation trench 920 profile is reentrant, or tapered, with the top 924 of the isolation trench 920 being narrower than the bottom 922 of the isolation trench 920. Tapering of the isolation trench 920 ensures that good electrical isolation is achieved in subsequent processing. Profile tapering can be achieved in reactive ion etching by tuning the degree of passivation, or by varying the parameters (power, gas flows, pressure) of the discharge during the etching process. Because the isolation trench 920 is filled with dielectric material, the opening at the top 924 of the isolation trench 920 is typically less than 2 um in width. The isolation trench 920 depth is typically in the range 10-50 um. In the preferred embodiment, the isolation trench 920 etch stops at the buried oxide layer 912. A common procedure for etching the isolation trench 920 is to alternate etch steps ($SF_6$ and argon mixture) with passivation steps (Freon with argon) in an ICP plasma to achieve etch rates in excess of 2 um/min at high selectively to photoresist (>50:1) and oxide (>100:1). The power and time of the etch cycles are increased as the trench deepens to achieve the tapered profile. Although the trench geometry is preferably reentrant, arbitrary trench profiles can be accommodated with adjustments in microstructure processing. Good isolation results can be achieved with any of a number of known trench etch chemistries. After the silicon trench is etched, the photoresist layer 916 is removed with wet chemistry or dry ashing techniques, and the masking layer 914 is removed with a reactive ion etch ("RIE") or buffered hydrofluoric acid.

Referring to FIG. 9D, the isolation trench 920 is then filled with an insulating dielectric material, typically silicon dioxide. The filling procedure results in the mostly solid isolation segment in the isolation trench 920, and serves to deposit a layer of dielectric material on the top side 10 (top surface) of the silicon wafer 910 and dielectric layers on the sidewall 928 and bottom 922 of the isolation trench 920. The thickness of the deposited layer is usually in excess of 1 um. This fill can be accomplished with chemical vapor deposition ("CVD") techniques or preferably with oxidation of silicon at high temperatures. In thermal oxidation, the wafer is exposed to an oxygen rich environment at temperatures from 900-1150° C. This oxidation process consumes silicon surfaces to form silicon dioxide. The resulting volumetric expansion from this process causes the sidewalls of the trenches to encroach upon each other, eventually closing the trench opening. In a CVD fill, some dielectric is deposited on the walls but filling also occurs from deposition on the bottom of the trench. CVD dielectric fill of trenches has been demonstrated with TEOS or silane mixtures in plasma enhanced CVD chambers and low pressure CVD furnace tubes.

During the isolation trench 920 filling process, it is common for most isolation trench profiles to be incompletely filled, causing an interface 932 and a void 930 to be formed in the isolation trench 920. A local concentration of stress in the void 930 can cause electrical and mechanical malfunction for some devices, but is generally unimportant for micromechanical devices due to the enclosed geometry of the isolation trench 920. The interface 932 and void 930 can be eliminated by shaping the isolation trench 920 to be wider at the isolation trench opening located at the top 924 of the isolation trench 920 than the bottom 922 of the isolation trench 920. However, good electrical isolation would then require additional tapering of the microstructure trench etch in the later steps. Another artifact of the isolation trench filling process is an indentation 926 that is created in the surface of the masking layer 914 centered over the isolation trench 920. This indentation is unavoidable in most trench filling processes, and can be as deep as 0.5 um, depending on the thickness of the deposition. To remove the indentation 926, the surface is planarized to form a flat, or substantially flat, surface, as illustrated in FIG. 9E, for subsequent lithographic and deposition steps. Planarization is performed either by chemical-mechanical polishing (CMP) or by depositing a viscous material, which can be photoresist, spin-on glass, or polymide, and flowing the material to fill the indentation 926 to a smooth finish. During etchback of the viscous material, which is the second step of planarization, the surface is etched uniformly, including the filled indentation. Therefore, by removing part of the surface oxide layer, the indentation 926 is removed to create a uniform thickness layer. For example, if the masking layer 914 is originally 2 um in thickness, then planarization to remove the indentation 926 leaves a masking layer 914 having a final thickness of less than 1 um. The top side 10 (upper surface) of silicon wafer 910 is free from imperfection and is ready for further lithography and deposition.

Figure 9F:
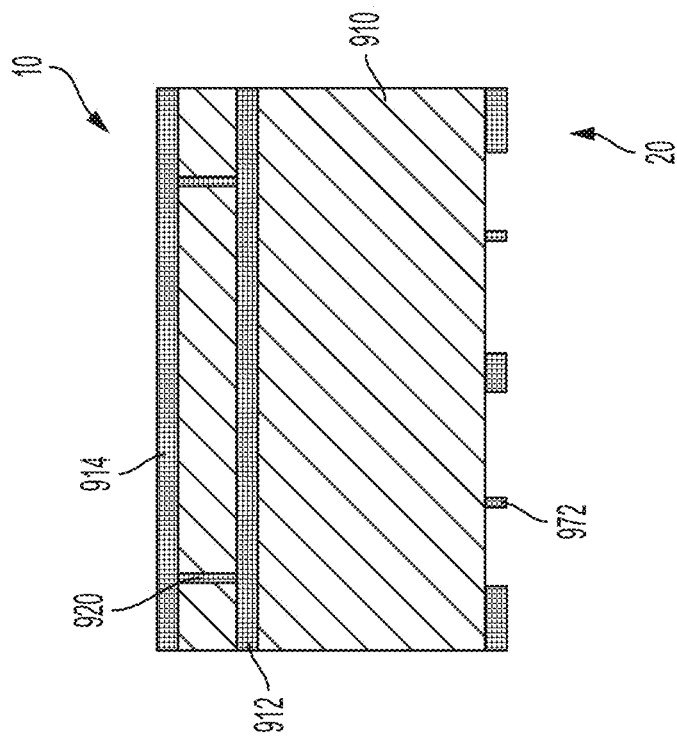
FIG. 9F illustrates isolation trenches on top of a wafer and a masking layer for blades on a bottom of the wafer.
Figure 9E:
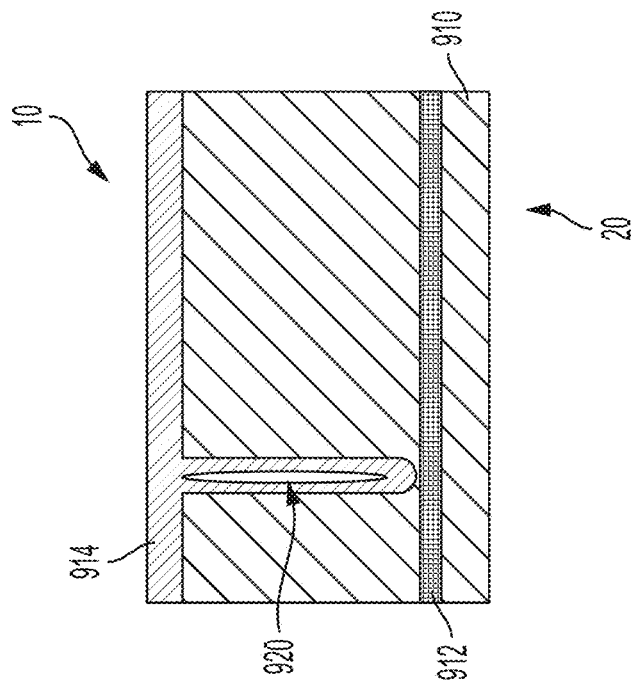
FIG. 9E illustrates a portion of a wafer after planarization of a dielectric layer.

FIG. 9F shows silicon wafer 910 with masking layer 914 and isolation trenches 920. After the isolation trenches 920 are fabricated, standard front-to-back alignment is used to lithographically pattern the masking layer for the blades on the bottom side 20 (backside) of the silicon wafer 910. The blade pattern 972 is exposed and etched into a masking layer 914. The masking layer 914 is typically a layer comprised of a combination of thermally grown silicon oxide and oxide deposited by chemical vapor deposition. It may also be comprised of a metal layer such as aluminum. The lithography pattern is transferred in the masking layer by reactive ion etching, yet the silicon blade etching is not completed until later in the process. Without the blades etched, the wafer is easily processed through the remaining device layers. The backside of the blade pattern 972 is typically aligned topside to the isolation trenches 920 to within several microns.

Figure 9H:
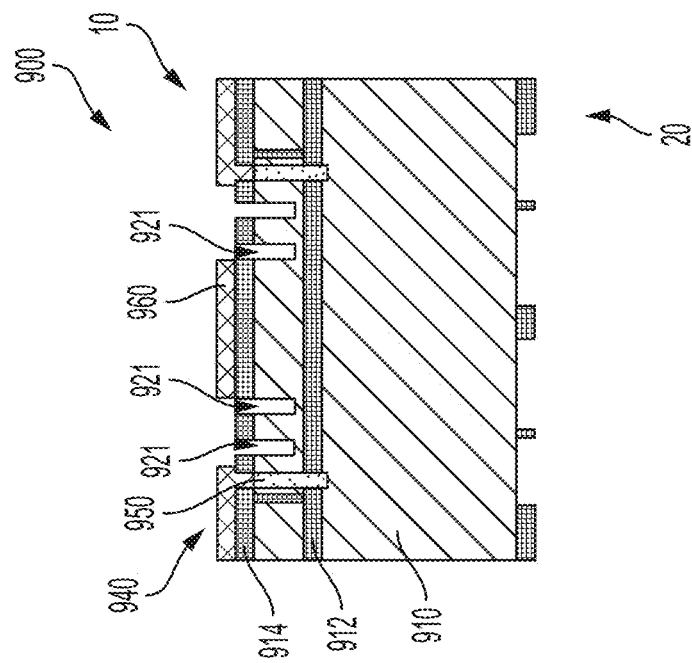
FIG. 9H illustrates trenches on the top of the wafer.
Figure 9G:
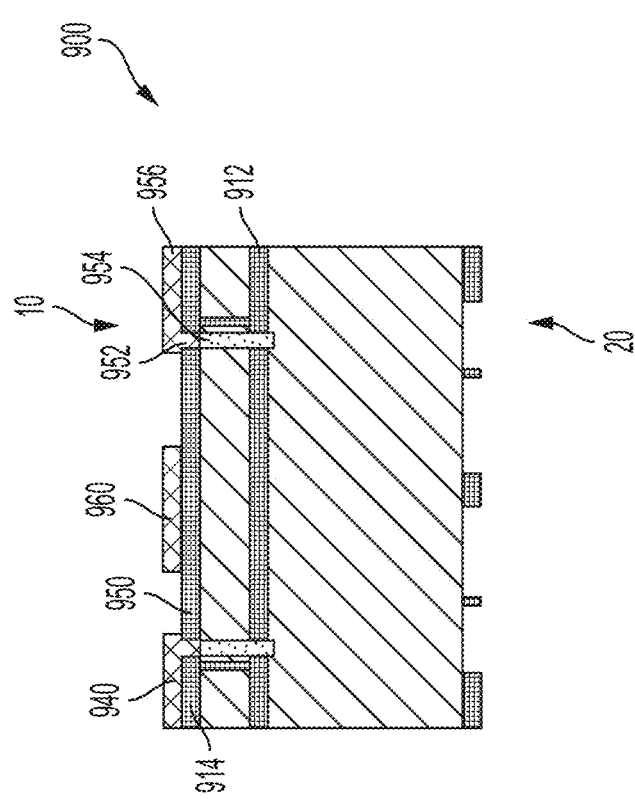
FIG. 9G illustrates metallization on the top of the wafer.

Metallization on the top side 10 of the silicon wafer 910 then proceeds as illustrated in FIG. 9G. In order to make contact to the underlying silicon wafer 910 vias 952 are patterned and etched into the masking layer 914 using standard lithography and reactive ion etching. After the vias 952 are etched, metallization is deposited to form a metal layer 940 and patterned to form a metal interconnect 956 and a contact 954 to the silicon wafer 910 through the via 952. For one embodiment, the metal is aluminum and is patterned using wet etching techniques. In mirror arrays with high interconnect densities, it is advantageous to pattern the metal using dry etching or evaporated metal lift-off techniques to achieve finer linewidths. The metal layer 940 is used to provide bond pads and interconnects, which connect electrical signals from control circuitry to each mirror to control mirror actuation.

Deposition of a second metal layer 960 provides a reflective mirror surface. This metal is tuned to provide high mirror reflectivities at the optical wavelengths of interest, and is typically evaporated and patterned using lift-off techniques to allow a broader choice of metallization techniques. For one embodiment, the metallization is comprised of 500 nm of aluminum. However, additional metal stacks such as Cr/Pt/Au may be used to increase reflectivities in the wavelength bands common to fiber optics. Because the metals are deposited under stress and will affect the eventual mirror flatness, it is advantageous to reduce the thickness of the masking layer 914 in the region of the mirror. This can be accomplished through the use of dry etching of the underlying dielectric prior to evaporation.

In FIG. 9H, the topside processing is completed. First, a passivation dielectric layer (not shown) may be applied to protect the metallization during subsequent processing. The passivation dielectric layer is removed in the region of the bonding pads. Second, the mirror structure including frame, mirror, and supports are defined using multiple etches that define trenches 921 separating the structural elements. The etches are self-aligned and proceed through the various metal, dielectric, and silicon wafers 910. A further blanket deposition is applied to the topside which passivates the sidewalls of the trenches 921 and prepares the topside for mechanical release.

Figure 9J:
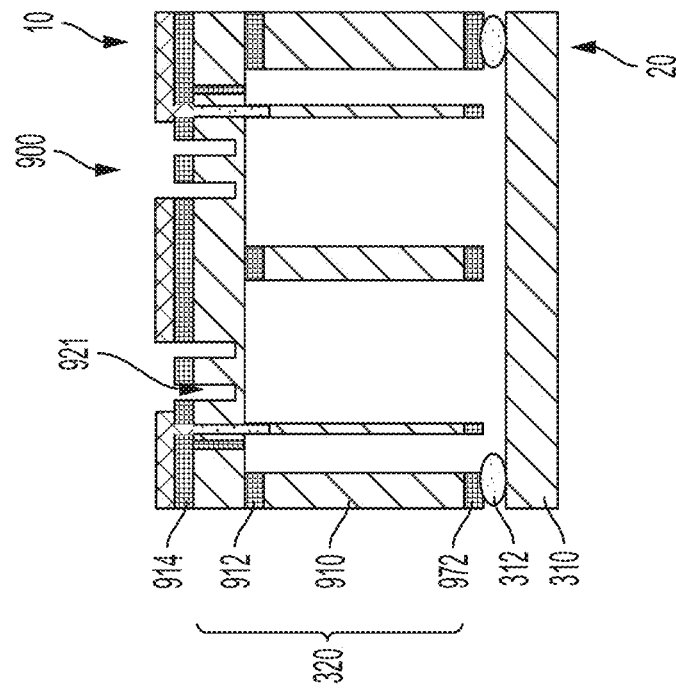
FIG. 9J illustrates a base wafer bonded to a wafer containing blades.
Figure 9I:
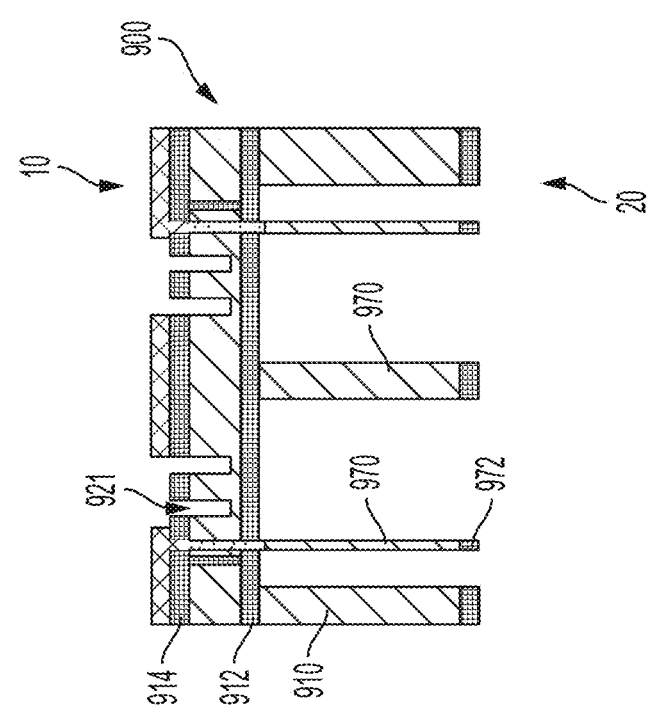
FIG. 9I illustrates blades that result from deep silicon etching.

As shown in FIG. 9I, backside silicon etching transfers the blade pattern 972 into the silicon wafer 910 substrate to obtain the blades 970. The etching is performed using deep silicon etching at high selectivity to oxide using the techniques disclosed in U.S. Pat. No. 5,501,893. The deep silicon etching achieves near vertical profiles in the blades 970, which can be nominally 5-20 um wide and in excess of 300 um deep. The etch stops on the buried oxide layer 912 to provide a uniform depth across the wafer while not punching through the top side 10 surface of the silicon wafer 910. Since the etch stops on the buried oxide layer 912, there is no need for elongated members 830 on central stage 802 to be used to remove etch depth variations across the device. Therefore, the different patterns of FIGS. 8B, 8C, and 8D are possible. All blades 970 can be etched simultaneously across the mirror element and across the mirror array. Buried oxide layer 912 may be etched at this time.

Referring to FIG. 9J, because the device wafer is now prepared for microstructure release, the device wafer 320 becomes more susceptible to yield loss due to handling shock or air currents. In order facilitate handling and aid in hermetically sealing the mirror array, a silicon wafer 310 is bonded to the device wafer 320 to protect the blades after release. For one embodiment, the bonding is accomplished through the use of a bonding element 322, such as a frit glass material bonding element, that is heated to its flow temperature and then cooled. In this manner, a 400° C. temperature bonding elements 312 produces a hermetic seal to surround the entire mirror array. The separation between the device wafer 320 and the silicon wafer 310 using the bonding elements 322, such as a frit glass material bonding element, allows the blades 970 to swing through high rotation angles without impedance. Typically, the standoff required is greater than 25 um.

Final structure release is accomplished on the wafer topside in FIG. 9K using a combination of dry etching of silicon dioxide and silicon, which punctures through the trenches 921 to suspend the movable elements of the mirror 336 and the frame 330. In addition, the release etch promotes electrical isolation by separating, for example, the silicon of the frame 330 from the silicon of surrounding members 338, 338' and device wafer 320. The vias 952 serve to connect the regions of silicon to the metal interconnects 956 (shown in FIG. 9G). To completely seal the mirrors from the outside environment, a lid wafer 350 is bonded to the device wafer 320, preferably through the bonding element 322 (e.g., frit glass seal). The lid wafer 350 is typically glass that allows incoming light to be transmitted with low loss in the mirror cavity 332, reflect off of the upper surface of the mirror 336, and transmit out of the mirror cavity 332.

Figure 10A:
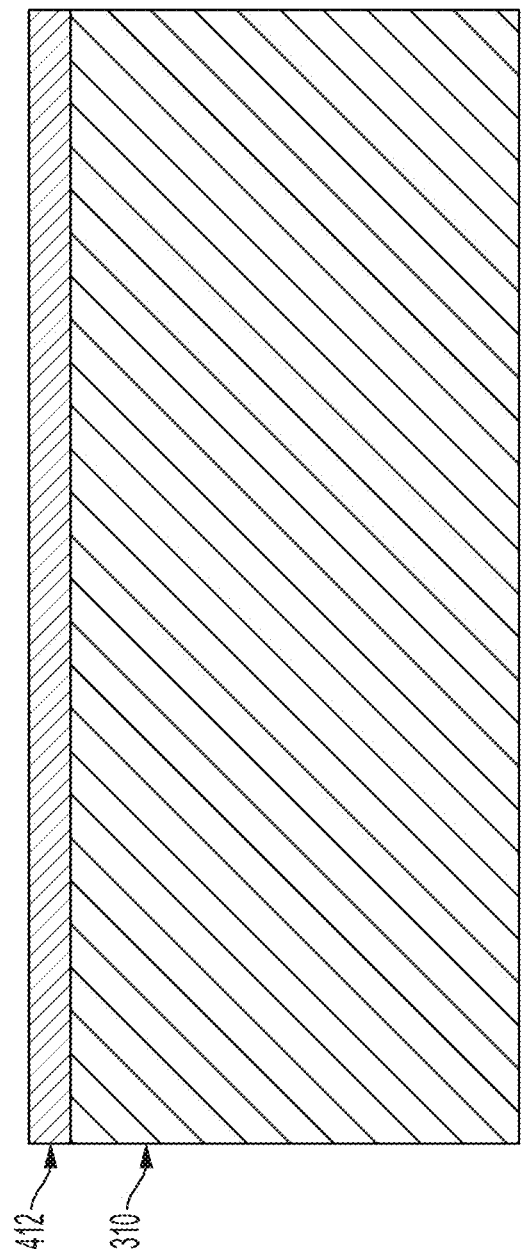
Figure 10C:
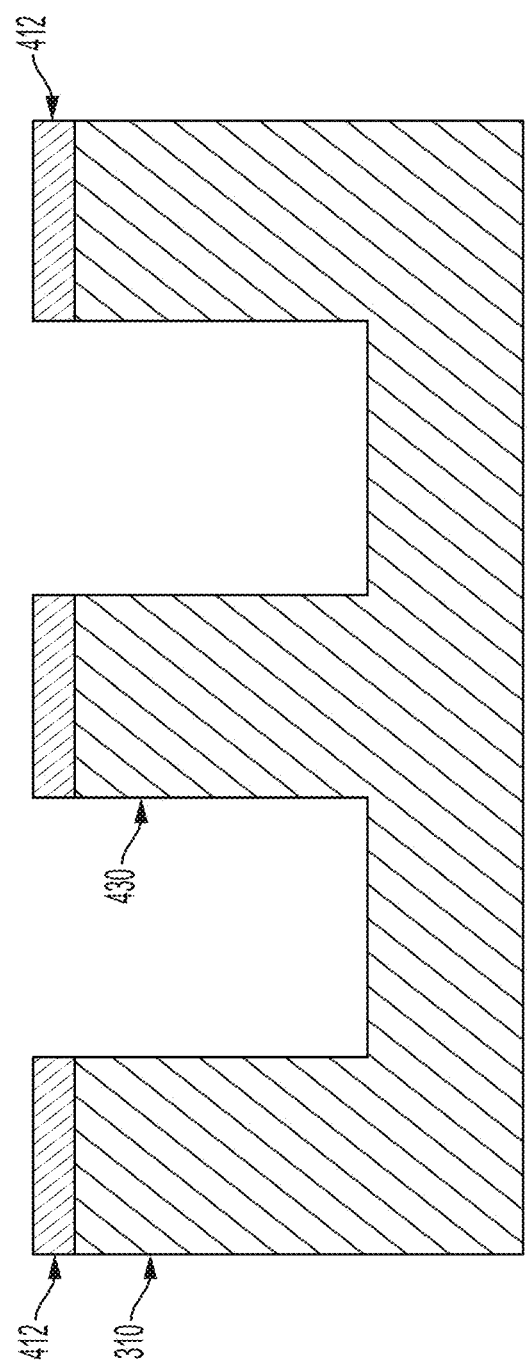

In another variation, prior to bonding with device wafer 320, the silicon wafer 310 is coated with a masking layer 412 (shown in FIG. 10A). This masking layer may be comprised of a combination of thermally grown silicon oxide and oxide deposited by chemical vapor deposition. It may also be comprised of a metal layer such as aluminum, germanium, or gold such as may be used for a eutectic or thermocompression bond. The masking layer 412 is patterned using standard lithography and reactive ion etching (as shown in FIG. 10B). Silicon etching transfers the pattern of the masking layer 412 into the silicon wafer 310 substrate to obtain the support anchors 430. The etching is performed using deep silicon etching at high selectivity to oxide using the techniques disclosed in U.S. Pat. No. 5,501,893. The etch depth allows the blades 970 to swing through high rotation angles without impedance. Typically, the depth required is greater than 25 um. The silicon wafer 310 is bonded to the device wafer 320 using, for example, eutectic bonding, thermo-compression bonding, fusion bonding or anodic bonding. During the boding process, the support anchors 430 contact the support webbing 334 (as shown in FIG. 4). In some configurations, the support anchors 430 bond to the support webbing 334. In other configurations, the support anchors 430 are in contact with the support webbing 334. Bonding or contact between the support anchors 430 and the support webbing 334 dampens any coupled mechanical motion from the mirrors 336 through their common anchors.

While preferred embodiments of the present invention have been shown and described herein, it will be obvious to those skilled in the art that such embodiments are provided by way of example only. Numerous variations, changes, and substitutions will now occur to those skilled in the art without departing from the invention. It should be understood that various alternatives to the embodiments of the invention described herein may be employed in practicing the invention. It is intended that the claims define the scope of the invention and that methods and structures within the scope of these claims and their equivalents be covered thereby.

What is claimed:

1. A microelectromechanical (MEMS) array, comprising:
   a first stage, a first frame pivotally coupled to the first stage, and a first stage reflective surface, wherein the first stage reflective surface has a first resonant frequency;
   a second stage, a second frame pivotally coupled to the second stage, and a second stage reflective surface, wherein the second stage reflective surface has a second resonant frequency; and
   a base wafer positioned below the first stage and the second stage, wherein the first stage is adjacent the second stage on a device wafer, wherein the device wafer is secured to the base wafer by a bonding element.

2. The MEMS array of claim 1, wherein the first stage is pivotally coupled to the first frame with a pair of first stage flexures and the second stage is pivotally coupled to the second frame with a pair of second stage flexures.

3. The MEMS array of claim 2, wherein the first stage flexures and the second stage flexures are configured to rotate about a single axis and substantially restrict rotation about other axes, the single axis residing along a length of one or more of the first stage flexures and the second stage flexures.

4. The MEMS array of claim 3, wherein the flexures comprise a plurality of torsion beams.

5. The MEMS array of claim 4, wherein the plurality of torsion beams are substantially parallel to one another.

6. The MEMS array claim 4, wherein each of the plurality of torsion beams has a torsion beam length and wherein the plurality of torsion beams are non-parallel along portion of the torsion beam lengths.

7. The MEMS array of claim 1, further comprising:
   a first set of one or more first stage blades coupled to the first stage, the first set of one or more first stage blades electrically connected to each other; and a second set of one or more first stage blades coupled to the first stage, the second set of one or more first stage blades electrically connected to each other; and
   a first set of one or more second stage blades coupled to the second stage, the first set of one or more second stage blades electrically connected to each other; and a second set of one or more second stage blades coupled to the second stage, the second set of one or more second stage blades electrically connected to each other.

8. The MEMS array of claim 1, further comprising:
   a third stage, a third frame pivotally coupled to the third stage, and a third stage reflective surface, wherein the third stage reflective surface has a third resonant frequency, further wherein the third stage is positioned on the base wafer adjacent the first stage on a first side and the second stage on a second side perpendicular to the first side.

9. The MEMS array of claim 8, further comprising:
   a fourth stage, a fourth frame pivotally coupled to the fourth stage, and a fourth stage reflective surface, wherein the fourth stage reflective surface has a fourth resonant frequency, further wherein the fourth stage is positioned on the base wafer adjacent at least one of the first stage, the second stage and the third stage.

10. The MEMS array of claim 1 wherein the base wafer further comprises a support anchor in contact with a support webbing, further wherein the contact between the support anchor and the support webbing is operable to dampen mechanical motion of the reflective surface.

11. A microelectromechanical (MEMS) array, comprising:
    a first stage, a first frame pivotally coupled to the first stage, and a first stage reflective surface; and
    a base wafer positioned below the first stage, wherein the base wafer further comprises a support anchor in contact with a support webbing, further wherein the contact between the support anchor and the support webbing is operable to dampen mechanical motion of the reflective surface.

12. The MEMS array of claim 11, wherein the first stage is pivotally coupled to the first frame with a pair of first stage flexures.

13. The MEMS array of claim 12, wherein the first stage flexures are configured to rotate about a single axis and substantially restrict rotation about other axes, the single axis residing along a length of the flexures.

14. The MEMS array of claim 13, wherein the flexures comprise a plurality of torsion beams.

15. The MEMS array of claim 14, wherein the plurality of torsion beams are substantially parallel to one another.

16. The MEMS array claim 14, wherein each of the plurality of torsion beams has a torsion beam length and wherein the plurality of torsion beams are non-parallel along portion of the torsion beam lengths.

17. The MEMS array of claim 11, further comprising:
a first set of one or more first stage blades coupled to the first stage, the first set of one or more first stage blades electrically connected to each other; and a second set of one or more first stage blades coupled to the first stage, the second set of one or more first stage blades electrically connected to each other.

18. The MEMS array of claim 11 further comprising a device wafer secured to the base wafer by a bonding element.

* * * * *